(12) United States Patent
Birner et al.

(10) Patent No.: US 6,660,582 B2
(45) Date of Patent: Dec. 9, 2003

(54) METHOD OF FORMING A VERTICAL FIELD-EFFECT TRANSISTOR DEVICE

(75) Inventors: Albert Birner, Dresden (DE); Matthias Goldbach, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/272,386

(22) Filed: Oct. 15, 2002

(65) Prior Publication Data

US 2003/0073271 A1 Apr. 17, 2003

(30) Foreign Application Priority Data

Oct. 12, 2001 (EP) .............................. 01124541

(51) Int. Cl.[7] ........................................... H01L 21/8242
(52) U.S. Cl. ..................... 438/245; 438/246; 438/269
(58) Field of Search ............................... 438/242, 243, 438/245, 246, 269, 270, 388, 389

(56) References Cited

U.S. PATENT DOCUMENTS

| | | | | |
|---|---|---|---|---|
| 5,102,817 A | * | 4/1992 | Chatterjee et al. | 438/246 |
| 5,744,386 A | * | 4/1998 | Kenney | 438/245 |
| 6,063,657 A | | 5/2000 | Bronner et al. | 438/244 |
| 6,242,310 B1 | * | 6/2001 | Divakaruni et al. | 438/269 |
| 6,262,448 B1 | | 7/2001 | Enders et al. | 257/302 |
| 6,566,177 B1 | * | 5/2003 | Radens et al. | 438/388 |

FOREIGN PATENT DOCUMENTS

| | | |
|---|---|---|
| DE | 196 20 625 C1 | 10/1997 |
| DE | 199 41 148 A1 | 4/2001 |
| DE | 199 46 719 A1 | 4/2001 |
| EP | 0 791 959 A1 | 8/1997 |

* cited by examiner

*Primary Examiner*—Chandra Chaudhari
(74) *Attorney, Agent, or Firm*—Laurence A. Greenberg; Werner H. Stemer; Ralph E. Locher

(57) ABSTRACT

It is proposed when forming field-effect transistor devices in a semiconductor substrate for the overlapping region of a source-drain region that is to be provided to be formed directly as a material region, in particular with outdiffusion processes being avoided to the greatest extent. This takes place in particular by forming the connection region or buried-strap region as selectively epitaxially grown-on single-crystal, possibly doped silicon.

58 Claims, 20 Drawing Sheets

METHOD OF FORMING A VERTICAL FIELD-EFFECT TRANSISTOR DEVICE

BACKGROUND OF THE INVENTION

Field of the Invention

The invention relates to a method of forming a field-effect transistor in a semiconductor substrate. For connecting the field-effect transistor to a first conductivity region of the semiconductor substrate, a connection region to a source-drain region of the field-effect transistor is formed. For forming a potential source-drain channel path of the field-effect transistor device, an overlapping region of the source-drain region and/or of the connection region is provided with a gate insulating region.

In the case of many semiconductor circuit configurations, appropriate field-effect transistors have to be provided in a semiconductor substrate to form and connect up the underlying semiconductor circuit configuration. In particular, field-effect transistors of this type serve for connecting to a conductivity region, for example a bit line connection, an electrode connection or the like, of the semiconductor substrate, with a corresponding connection region, for example a buried-strap region, being provided for the connection of the source-drain region of the transistor to a top electrode of a storage capacitor. Furthermore, a spatial overlapping region of the source-drain region of the field-effect transistor is provided with a gate insulating region, to allow a source-drain channel path of the field-effect transistor device to be formed during operation.

The corresponding connection regions and/or the overlapping regions with the gate insulating region are usually formed as what are known as diffusion regions or diffusion contacts, with appropriate dopant material and consequently charge carriers being distributed in a thermally induced manner in the semiconductor substrate with different concentrations from a material region provided as a dopant depot.

It is problematical in this case that the underlying diffusion processes for forming the charge carrier distributions in a given material region proceed substantially isotropically. If a vertical direction of propagation is preferred, for example for contacting with vertical transistors, this results in that a lateral diffusion of the charge carriers nevertheless also takes place, with the result that under some circumstances countermeasures have to be taken to avoid undesired instances of contacting. The countermeasures have until now been realized by a greater spacing between conductivity regions or components that are to be insulated from one other. On account of this necessity to maintain minimum spacings, there are limits to the objective of highest possible component integration in an extremely small space.

SUMMARY OF THE INVENTION

It is accordingly an object of the invention to provide a method of forming a vertical field-effect transistor that overcomes the above-mentioned disadvantages of the prior art methods of this general type, in which undesired instances of contacting of neighboring components of highly integrated circuits can be prevented in a simple way.

With the foregoing and other objects in view there is provided, in accordance with the invention, a method of forming a field-effect transistor device. The method includes providing a semiconductor substrate, forming a connection region in the semiconductor substrate, forming a conductivity region in the semiconductor substrate, and forming a source drain region. The connection region extends to the source-drain region for connecting the field-effect transistor device to the conductivity region. A potential source-drain channel path of the field-effect transistor device is formed by providing a gate insulating region to an overlapping region of the source-drain region and/or the connection region. The overlapping region is formed directly as a material region.

The method according to the invention of forming a field-effect transistor in a semiconductor substrate is characterized in that the respective overlapping region, in particular the source-drain region, of the field-effect transistor device is formed directly as a material region, in particular with lateral outdiffusion processes being avoided to the greatest extent.

Consequently, a fundamental idea of the present invention is to form and/or deposit the overlapping region of the connection region and/or of the source-drain region directly as a material. This takes place in contrast to conventional procedures, in which an overlapping region is initially formed in an electrically insulating manner, with the electrical contacting subsequently taking place indirectly, that is by outdiffusion of appropriate dopant material and consequently by subsequent introduction and distribution of corresponding charge carriers into the semiconductor region, which in itself is electrically insulating. With the direct material-based and electrically conducting contacting of the gate insulating region or gate oxide region with the connection region, the buried-strap region, or the source-drain region of the field-effect transistor, there is no longer the necessity for the subsequent distribution of charge carriers by outdiffusion, because an electrically conductive material region or a corresponding region for the electrical contacting of the gate insulating region with the remaining regions is provided directly.

In the case of a particularly preferred embodiment of the method according to the invention, the connection region and the overlapping region are formed substantially from the same material.

It is further preferred that the connection region and the overlapping region are formed substantially as one part or as one piece, whereby the process sequences can be made particularly simple and difficulties with regard to material compatibility are then avoided.

According to a further preferred embodiment of the method according to the invention, it is provided that the connection region and/or the overlapping region are grown on epitaxially and/or are formed as a single crystal, in particular as a selective epitaxial single-crystal doped silicon or the like.

According to a further embodiment of the method according to the invention, it is provided that, to avoid or suppress outdiffusion processes from the connection region and/or the overlapping region and/or to avoid or suppress undesired electrical contacts of the connection region and/or of the overlapping region with further regions, the connection region and/or the overlapping region are at least partially enclosed in an insulating region.

It is particularly advantageous if the connection region and/or the overlapping region are formed as a buried-strap structure, as a buried-strap region and/or as part thereof, in particular in a substantially buried form.

According to a further embodiment of the method according to the invention, the respective field-effect transistor device is formed as a vertical trench-structure transistor device, in particular as a deep-trench transistor or the like and/or in particular for connecting to and/or for a DRAM memory cell or the like.

For this purpose, a recess or a trench is respectively formed in the semiconductor substrate.

In an upper trench portion with upper edge regions or upper wall regions, the vertical trench-structure transistor device is formed with gate regions that are substantially electrically insulated with respect to the upper edge regions or upper wall regions and with respect to a middle trench portion to be provided.

It is further provided that, spatially adjoining the insulated gate region, substantially directly, in particular spatially beneath it, the source-drain region and the connection region are provided and formed in the region of the middle trench portion.

Furthermore, it is provided that the first conductivity region to be contacted is provided and formed substantially in a lower trench portion for forming a substantial electrical conducting contact at least with the connection region.

According to a particularly preferred embodiment of the method according to the invention, it is provided that a mask region is deposited on a surface region, which may be formed in a substantially planar manner, of the semiconductor substrate, if appropriate formed in a multi-layered manner, and is structured with recesses in accordance with a desired trench structure to be formed.

Furthermore, it is provided that a single-crystal semiconductor material is used as the semiconductor substrate, in particular a single-crystal silicon, if appropriate p-doped, and/or the like.

It is particularly advantageous for the method according to the invention that, if appropriate, the respective recess and/or the respective trench are structured in a number of process steps temporally separated and/or interrupted from one another, so that in the meantime other structuring processes can be included in an advantageous way.

It is provided in this case that the upper trench portion with upper edge regions or wall regions is etched into the semiconductor substrate, in particular with a depth in the range of 1 $\mu$m, in particular for the vertical trench-structure transistor device, with a first temporary bottom region being formed in the recess or in the trench.

The upper trench portion is widened, in particular laterally, preferably by a substantially isotropic etching-back step and/or in particular by a silicon pull-back process, preferably in the range of a layer thickness of about 5 nm.

A first protective layer or insulating layer is deposited, in particular in a conformal manner and/or in particular with a layer thickness in the range of about 5 nm, preferably as an $Si_3N_4$ liner or the like.

Then, furthermore, by etching, in particular anisotropic etching, with penetration of the first protective layer at the first temporary bottom region of the recess or trench, the second, middle trench portion with middle wall regions or edge regions is formed, in particular for the connection region, for the source-drain region and/or for the overlapping region or for parts thereof, preferably with a depth in the range of about 200–300 nm, with a second temporary bottom region being formed in the recess or in the trench.

The middle trench portion is widened, in particular laterally, to be precise preferably by an isotropic etching-back step and/or in particular by a silicon pull-back process, preferably in the range of a layer thickness of about 20 to 40 nm, thereby creating recesses in the region of the middle side walls, edge regions or wall regions of the middle trench portion, in particular for the connection region, source-drain region and/or overlapping region to be provided, or parts thereof.

For forming the insulating region for the connection region, the source-drain region and/or the overlapping region and/or for parts thereof, a second protective layer or insulating layer is formed, in particular in a conformal manner, with a layer thickness in the range of about 10 nm and/or in particular using silicon dioxide $SiO_2$, oxidized silicon nitride $Si_3N_4$ and/or the like.

Furthermore, for forming the connection region, the source-drain region and/or the overlapping region and/or parts thereof, it is provided that a single-crystal seed region is formed, in particular for forming the first-mentioned regions as selective semiconductor material regions grown on epitaxially as a single crystal.

The single-crystal seed region is formed by etching, in particular anisotropic etching, with penetration of the second protective layer or insulating layer at the second temporary bottom region of the second or middle trench portion, exposing underlying single-crystal semiconductor substrate at the second temporary bottom region, with the further option that the second temporary bottom region is easily removed by etching in the sense of an overetching process. For forming the buried strap in the sense of a connection region, source-drain region and/or overlapping region or for parts thereof, it is provided that single-crystal semiconductor substrate is grown in a selectively epitaxial manner on the single-crystal seed region in such a way that the middle trench portion is completely filled. In particular, the middle trench portion is filled to just above the level of the first temporary bottom region of the recess or the trench, with a varying dopant concentration being introduced if appropriate, in particular in the form of a concentration gradient, and/or the lateral recesses in the region of the second, middle trench portion for the buried-strap region as a connection region, source-drain region and/or overlapping region and/or parts thereof in the region of the middle wall regions or edge regions being completely filled in particular.

The middle trench portion, which was closed by the epitaxial growing and filling, is opened again, to be precise to just below the level of the second temporary bottom region, in particular by anisotropic etching, with material of the second protective layer or insulating layer in the region of the upper edge regions or wall regions being removed in particular.

A third protective layer or insulating layer is formed, so that the second temporary bottom region and, in the region of the middle wall regions or edge regions of the middle trench portion of the recess or of the trench, the selectively epitaxially grown-on single-crystal material in the recesses for the buried-strap region, that is for the connection region, the source-drain region and/or the overlapping region or for parts thereof, is covered.

Preferably, the forming of the third protective layer or insulating layer takes place by thermal oxidation. Selective electrochemical depositing and/or transforming, in particular by oxidation of the silicon material, is also conceivable.

Following that, the third or lower trench portion of the recess or of the trench is then formed by etching, in particular anisotropic etching. Following that, a trench capacitor, for example, can then be formed in the region of the lower trench portion. This takes place, for example, by forming a buried-plate structure as the bottom electrode, subsequent filling with a node dielectric and subsequent introduction of a top electrode. Then, the first conductivity region is created, for example as part of the top electrode or as a connection for it, in this third or lower trench portion, preferably to a level below the first temporary bottom region, preferably by filling the trench with polysilicon or the like and appropriate anisotropic etching back to the desired level. A fourth protective layer or insulating layer is provided if appropriate between the semiconductor substrate and the material of the first conductivity region.

The material of the third protective region or insulating region is selectively removed, in particular in the region covering the selectively epitaxially grown-on single-crystal material in the recesses for the buried-strap region, from the regions, in particular by selective, wet-chemical etching.

This produces a corresponding gap or spacing between the material of the first conductivity region and the epitaxially selectively grown-on single-crystal material for the buried-strap region. The first conductivity region is electrically contacted with the connection region or the buried-strap region, in particular by filling the corresponding gaps with polysilicon and/or by selective epitaxial re-growing and closing of the gaps between the first conductivity region and the material of the connection region or the buried-strap region, with at least part of the middle wall regions or edge regions of the middle or second trench portion of the trench or of the recess, that is in particular of the connection region, remaining free and uncovered.

The surface region of the first conductivity region is then covered with a fifth protective layer or insulating layer, in particular of silicon dioxide $SiO_2$, with in turn part of the middle wall regions or edge regions of the middle trench portion of the trench or of the recess, that is the connection region, remaining free and uncovered. The fifth protective layer or insulating layer on the surface region of the first conductivity region serves classically as what is known as a trench top oxide (TTO).

It is further provided that, by etching, in particular isotropic etching, at least in the region of the transition between the middle trench portion and the upper trench portion and in particular in the recesses for the buried-strap region, that is in the recesses for the connection region, the source-drain region, the overlapping region and/or for parts thereof, respectively existing insulating layers or protective layers between the buried-strap region and the semiconductor substrate are removed, with a substantially laterally extending recess being created in particular in the upper region of the buried-strap region or connection region.

A material-based electrical contact between the remaining buried-strap region or connection region and the semiconductor substrate provided above it must be formed by filling the recess in the upper region of the connection region with an electrically conductive material.

In this case, the filling may be performed by selective epitaxial growing or re-growing or as part of a hydrogen reflow process.

After producing the filling, the filled region substantially forms the overlapping region to be provided with respect to the gate region to be provided and to be insulated.

For this purpose, to form the gate region of the trench-structure transistor device, a sixth insulating layer is deposited as a gate insulating region, in particular in the form of an oxide or the like, and/or in particular at the regions remaining free of the upper and/or middle edge regions or wall regions of the middle and upper trench portions of the trench. In this case, the volume of the trench or of the recess remaining free is filled with a second conductivity region as a gate contact.

These and further aspects of the present invention emerge from the comments now made.

The invention describes an integration sequence that realizes a DRAM cell which is formed completely in a deep trench, with self-adjusting Epi buried strap and without buried-strap outdiffusion and for the connection to the source-drain region of the VFET, and with the thermally induced BS outdiffusion being suppressed laterally by a dielectric shield and (optional) doping gradient in the Epi-layer.

The invention is based on the "CFE" concept, of the buried collar region and, integrated in this concept or in comparable DT concepts for vertical DRAM cells, an epitaxy-based buried strap (BS) or connection region.

Previous standard concepts (CCT, BPC) provide a sequential production of the DT, buried plate, node dielectric, poly fill, collar and buried strap in various sequences. In the case of the CCT concept, the sequence is used as just described. In the case of the BPC concept, the collar formation takes place between the DT etch and buried plate forming by using, inter alia, a dummy filling of polysilicon.

A distinctly different, innovative and very well scalable concept with a buried collar (CFE) integrates the realization of the collar into the DT etch, which is interrupted twice, in order to define the upper edge and the lower edge of the collar.

The central point of the formation of a buried strap has until now been achieved exclusively by outdiffusion from a highly doped poly filling through a SiN interface, supported by an implantation step. The (buried) strap is the critical element of a DRAM cell. Such a buried strap, as could be used advantageously for vertical trench concepts (VT cells) in particular, is described below.

The invention solves the given problem by integrating an epitaxy-based buried strap (BS) into the DT side wall. The buried strap sits on a diffusion barrier. The upper and lower delimitation of the buried strap is defined by interruptions in the DT etch. In this case, the connection region (buried strap) and drain of the selection transistor merge into one another and can accordingly no longer be geometrically separated from one another.

The following are obtained as additional simplifications:
a) suppression of the lateral outdiffusion from the BS region when there is low formation of the diffusion barrier (barrier height–100–200 nm);
b) complete suppression-of the lateral outdiffusion and realization of flat VFET junctions when there is high formation of the diffusion barrier (height >>200 nm); in this case, the risk of punch-throughs is also reduced, since the VFET is partly or entirely surrounded by a dielectric envelope (preferably $SiO_2$); SOI-similar behavior of the VFET;
c) reduction of the overall BS resistance by forming of a large overlapping area between the DT fill and the highly doped BS region; as a result: uncritical overlap between the upper edge of the DT fill and the BS region;
d) simplification of the collar; and
e) drain region of the transistor defined by Epi region of the buried strap; freedom of choice in the dopant concentration or the dopant gradient in the Epi layer makes a low BS>drain junction resistance possible.

An inventive step lies in the burying of the buried strap region into the DT side wall by a pull-back method and subsequent selective-epitaxial filling of the BS region with highly doped n-polysilicon. The single-crystal epitaxial growth is possible in concepts in which the DT etch is interrupted, so that there is still single-crystal silicon on the bottom. In this case, the upper and lower edges of the BS region are defined by interruption of the DT etching.

After the etching of a short DT, a protective layer is deposited, protecting the existing DT side wall from the later pull-back step. The layer may be, for example, a nitride. An "ONO" or an "NO" would satisfy this purpose. To protect the protective layer from the subsequent RIE steps, it may be advantageous to widen the DT slightly before the depositing of the layer.

After the silicon pull-back, which exposes the region in which the buried strap is ultimately to be located, an insulator layer is deposited, which in turn may be of, for example, $SiO_2$, $Si_3N_4$, "NO", "ONO", SiON. The layer is intended to prevent outdiffusion of dopant from the BS into the surrounding p-well. The shielding function can be finely set by the height of this layer (corresponds to the height of the epitaxial BS region). This layer is subsequently opened at the bottom by an RIE step.

By a selective epitaxial step, beginning from the bottom, the recess for the entire buried-strap region is filled. This may involve creating a dopant gradient, to finely set the BS, drain and channel properties. As a particularly extreme case, it should be mentioned here that the shield can also rise up completely over the entire VFET, so that possible junction problems caused by the Epi-Si<–>Si junction can be minimized.

Then the DT is completed, the (buried) collar is constructed, the buried plate is diffused in, the dielectric is deposited and the DT is filled, for example with highly doped polysilicon, for example as a top electrode.

The connection between the trench fill and the Epi BS is established by a further selective epitaxial step (undoped) or by a slight $H_2$ reflow.

The filling of the trench top oxide (TTO) follows, followed by the wet-chemical opening of the shield at the upper edge.

Then the connection of the BS/drain region to the rest of the VFET takes place by a further, undoped selective Epi step or a slight $H_2$ reflow step. Subsequently, the cell can be realized in accordance with a desired VFET concept.

Other features which are considered as characteristic for the invention are set forth in the appended claims.

Although the invention is illustrated and described herein as embodied in a method of forming a vertical field-effect transistor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
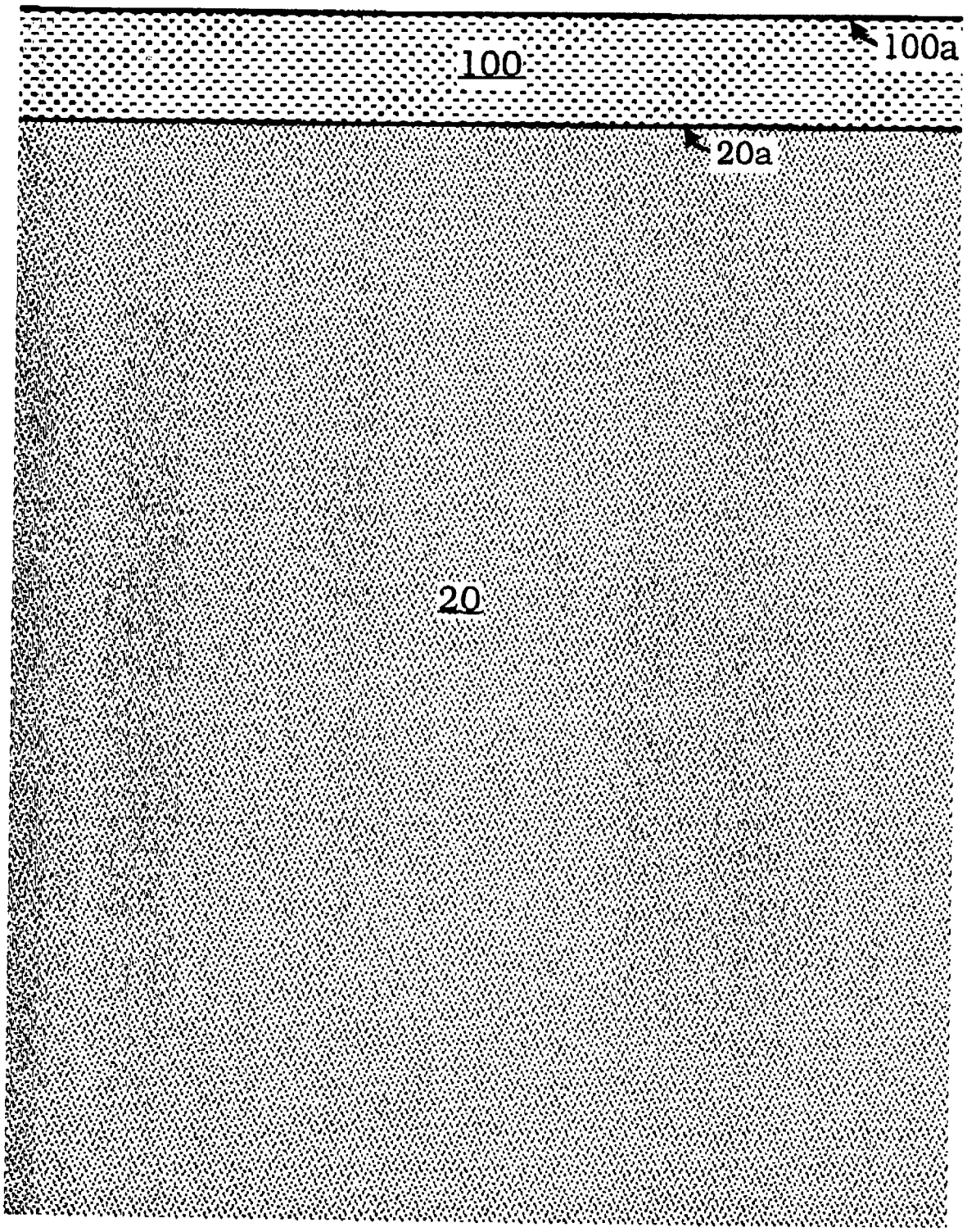
FIGS. 1–20 are diagrammatic, lateral cross-sectional views of various intermediate stages that are reached when producing a field-effect transistor device according to a preferred embodiment of a method according to the invention.

In all the figures of the drawing, sub-features and integral parts that correspond to one another bear the same reference symbol in each case. Referring now to the figures of the drawing in detail and first, particularly, to FIG. 1 thereof, there is shown a configuration-which is a starting point of an exemplary embodiment described below for a production method according to the invention. The configuration contains an etching mask layer 100 with a planar surface region 100a provided on a semiconductor substrate 20, for example a single-crystal p-doped bulk silicon region, with a planar surface region 20a.

Figure 2:
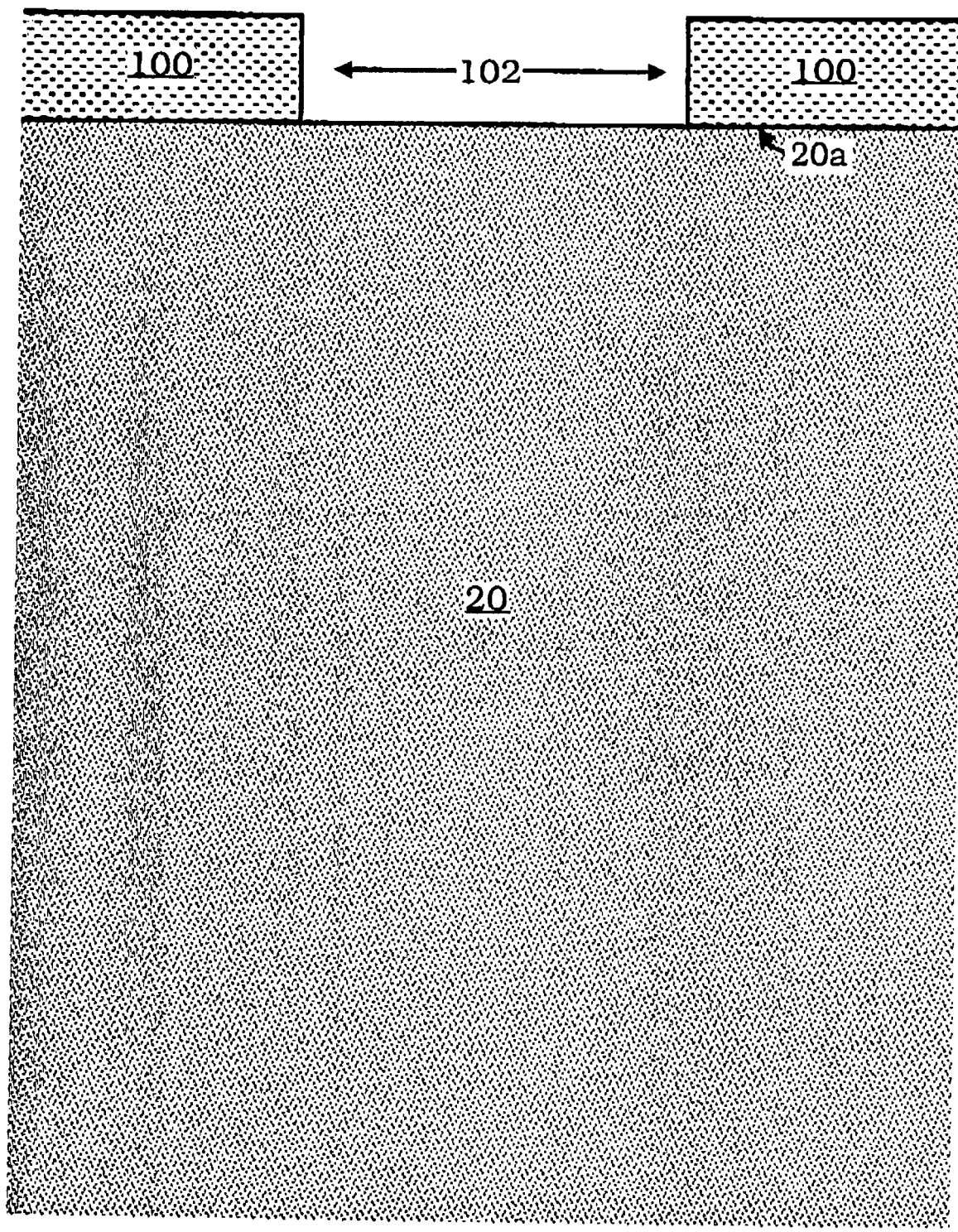

In the transition to the intermediate state shown in FIG. 2, recesses 102, which reach as far as the surface region 20a of the underlying semiconductor substrate 20, are then formed at predefined points in the etching mask layer 100. The positions of the respective recesses 102 define the positions of the trench-structured transistors to be formed.

Figure 3:
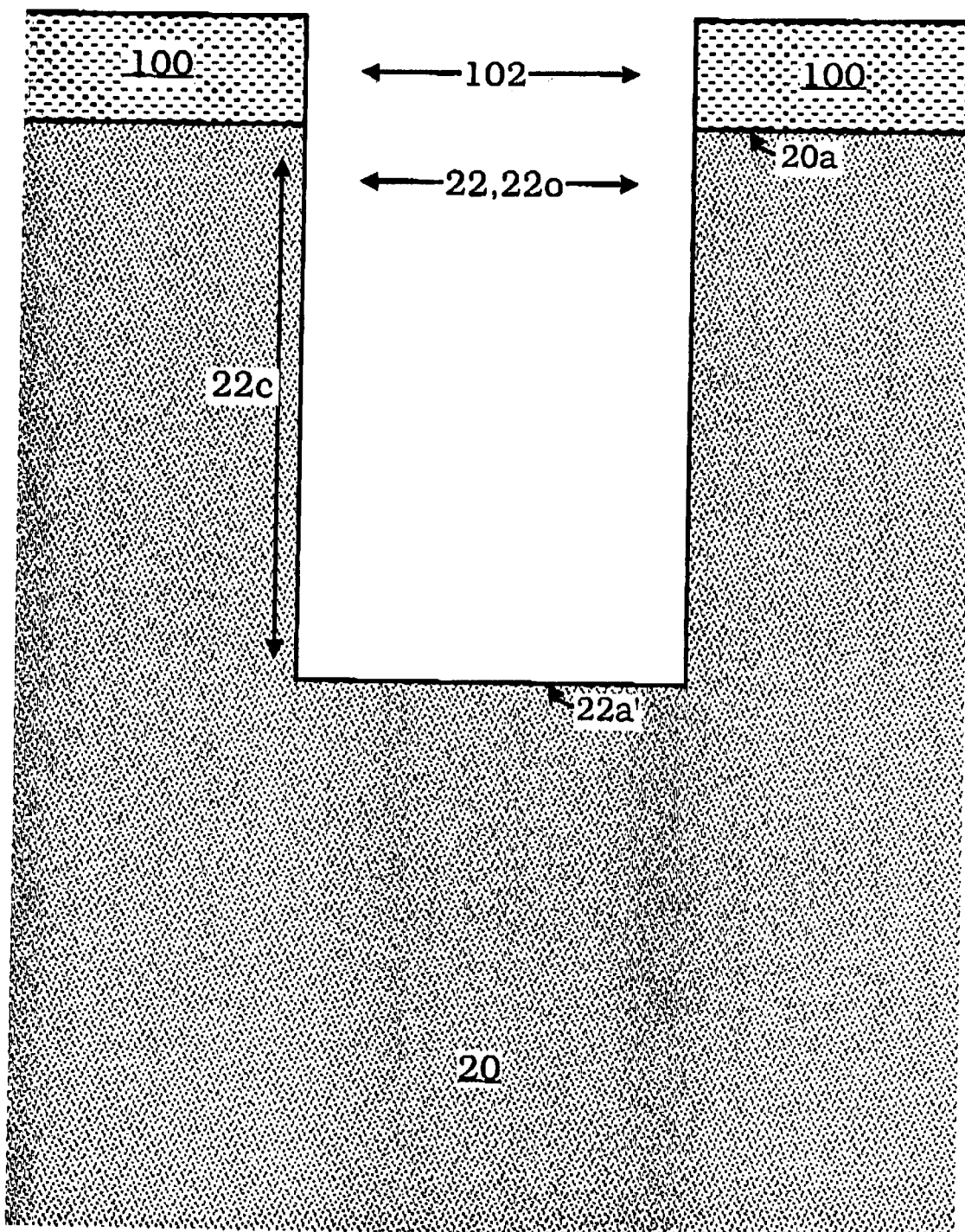

In the transition to the intermediate state shown in FIG. 3, a first or upper trench portion 22o of a trench 22 to be formed is then etched into the underlying semiconductor substrate 20 with a depth of approximately 1 µm by a first anisotropic etching step. The first or upper trench portion 22o serves substantially for receiving the vertically aligned field-effect transistor or VFET. It has upper edge regions 22c or wall regions 22c and a first temporary bottom region 22a'.

Figure 4:
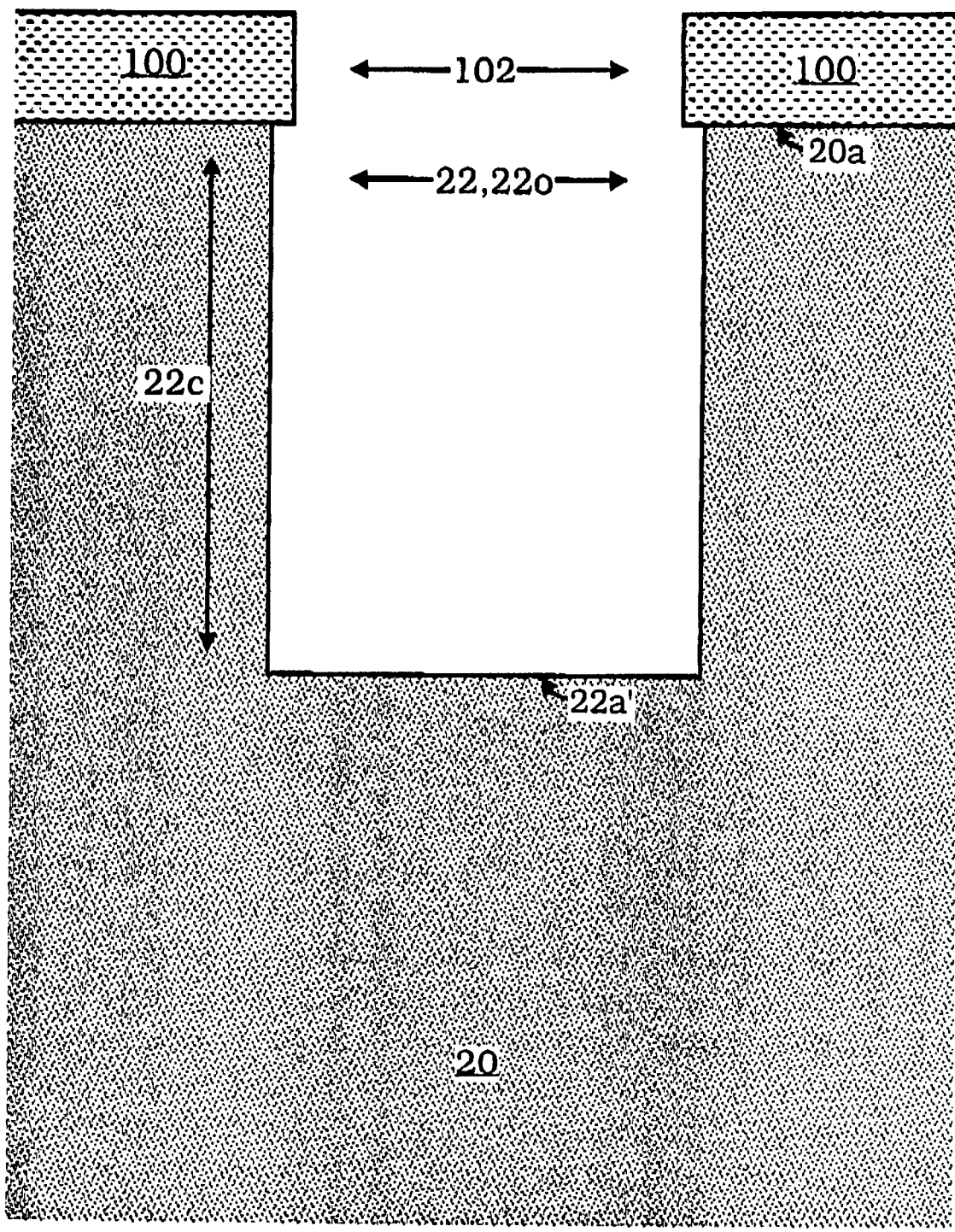

In the transition to the intermediate state shown in FIG. 4, the first or upper trench portion 22o is then isotropically widened by about 5 nm by a silicon pull-back method, so that pulled-back upper edge regions and wall regions 22c and a pulled-back first bottom region 22a' are produced.

Figure 5:
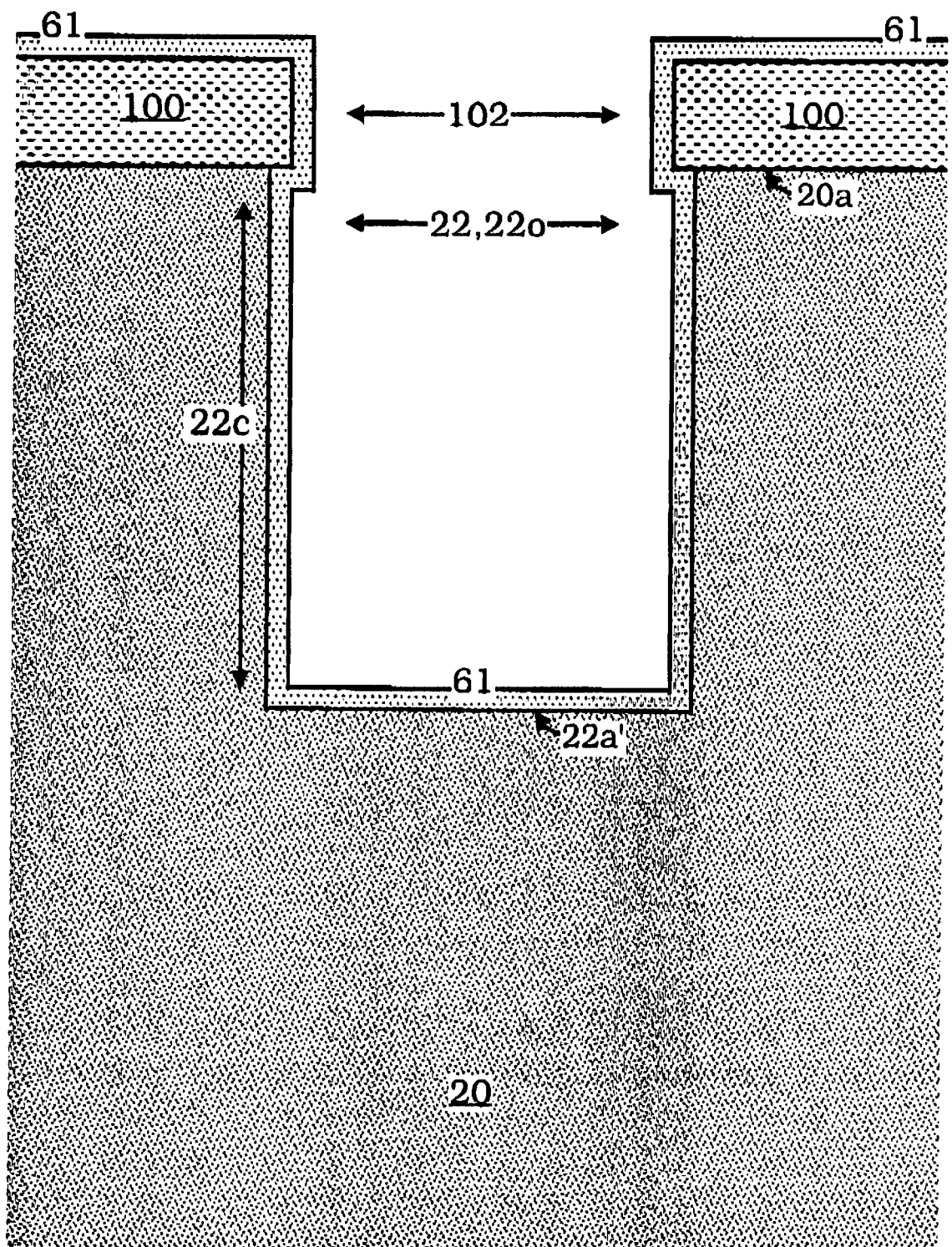

Following that, a first insulating layer 61 or protective layer 61 is then conformally deposited with a layer thickness of, for example, 5 nm in the form of a silicon nitride liner, as is shown in FIG. 5.

Figure 6:
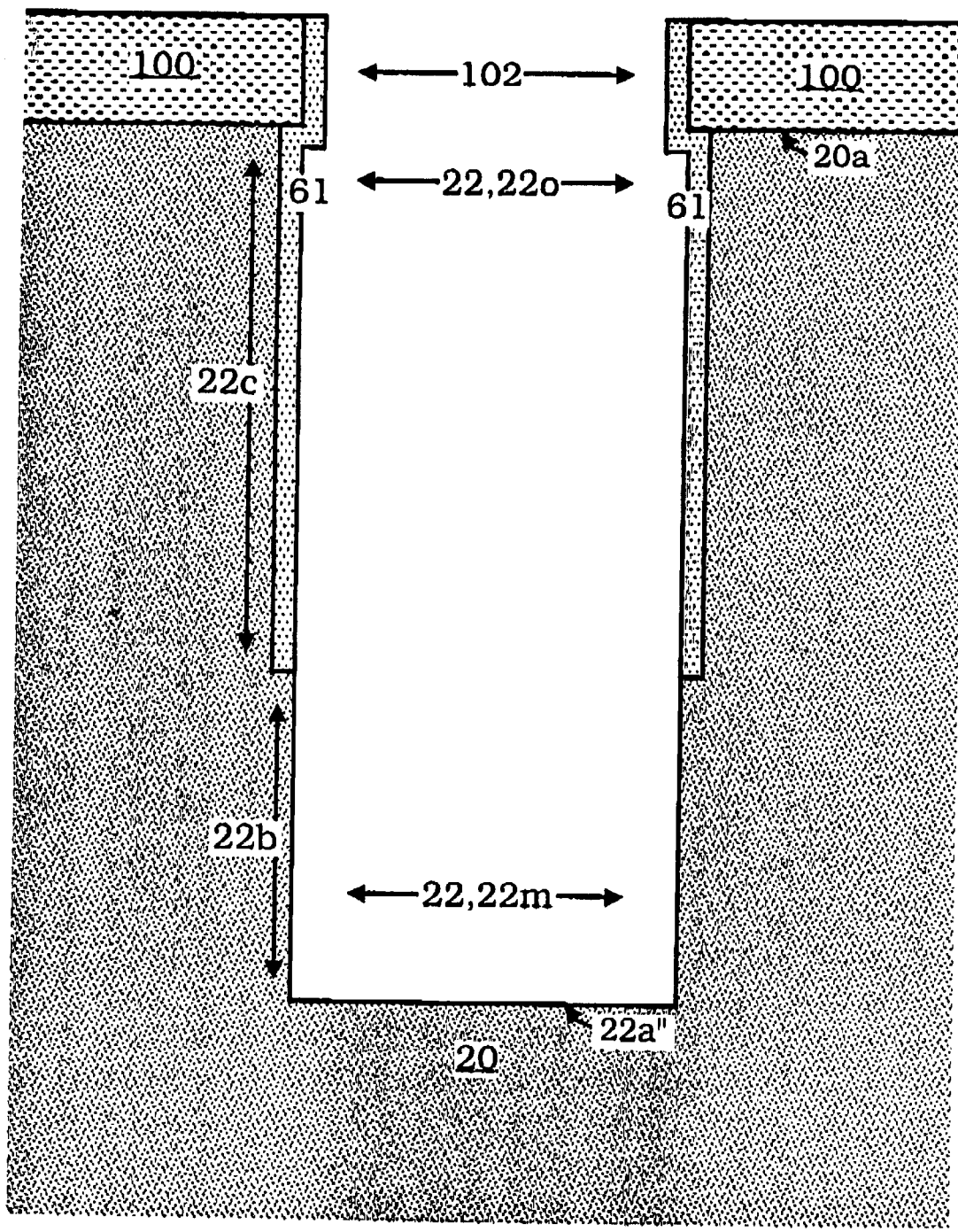

Then, in a further etching step, a continuation of the forming of the recess 22 or of the trench 22 takes place in an anisotropic manner by penetrating the silicon nitride liner 61 in the region of the first temporary bottom region 22a', with the second or middle trench portion 22m being formed with corresponding middle wall regions or edge regions 22b and a second temporary bottom region 22a", as is shown in FIG. 6.

Figure 7:
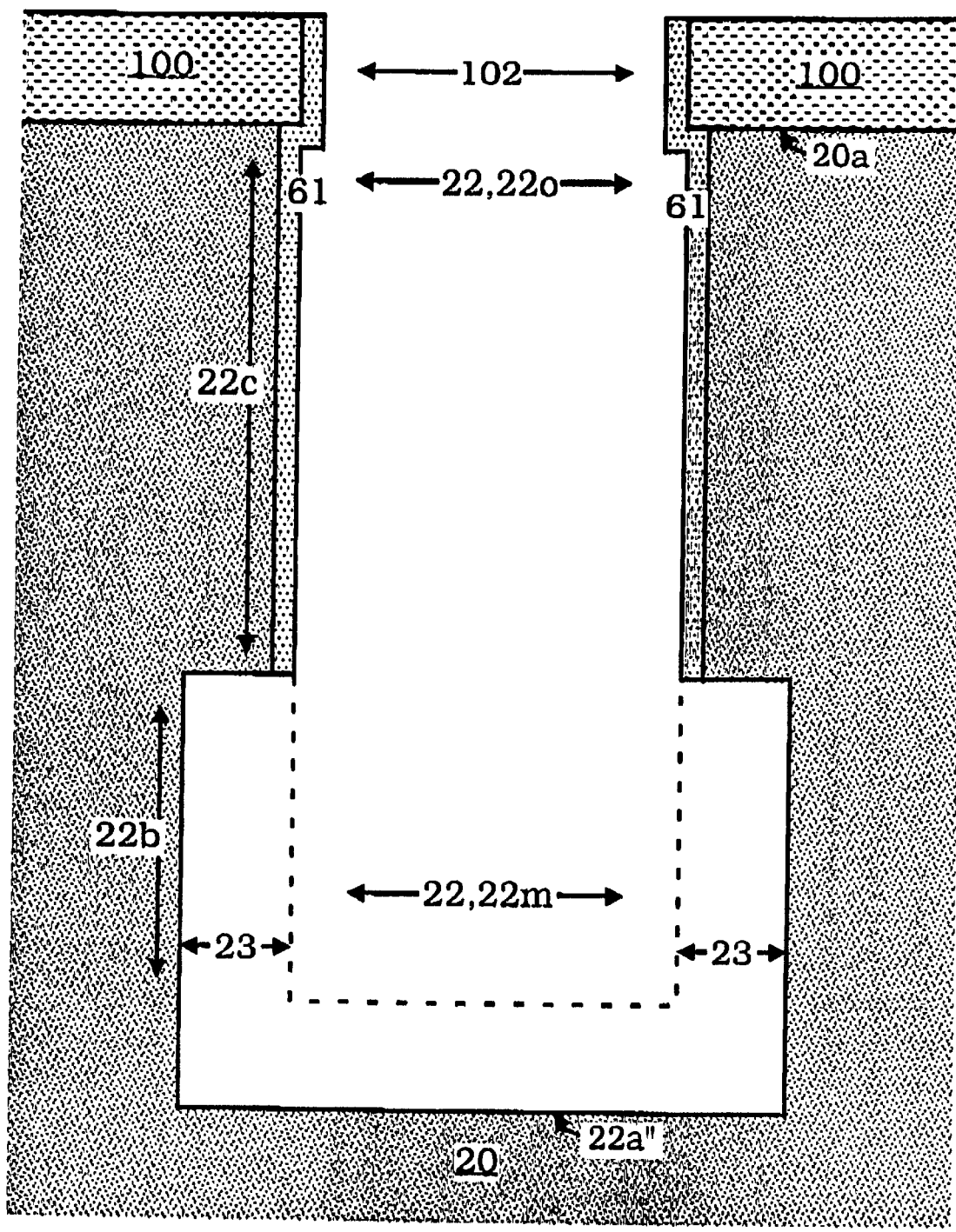

In the transition to the state of FIG. 7, the semiconductor material is then selectively etched back by an isotropic etching operation in such a way that the second or middle trench portion 22m is locally widened, whereas the upper edge regions or wall regions 22c remain uninfluenced by this on account of the silicon nitride liner 61. By the etching-back operation, for example with a layer thickness of 20 to 40 nm, recesses 23 are formed in the region of the second or middle trench portion 22m in the middle wall regions or edge regions 22b and serve for forming and receiving what is known as the buried-strap region, that is receiving the connection region, the source-drain region, the overlapping region and/or parts thereof.

Figure 8:
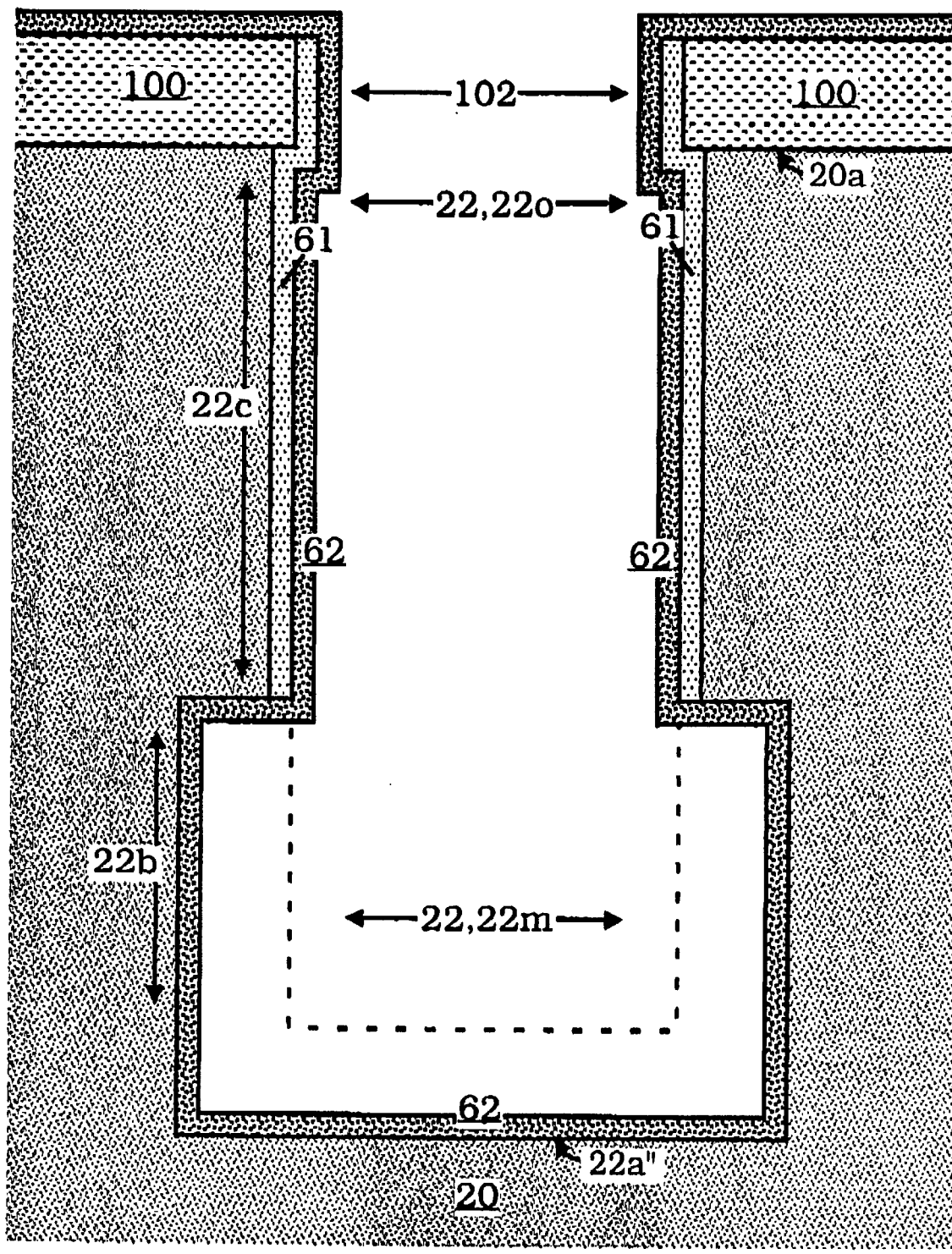

In the transition to the state of FIG. 8, a second insulating layer or protective layer 62 is then conformally deposited in the form of a silicon dioxide layer.

Figure 9:
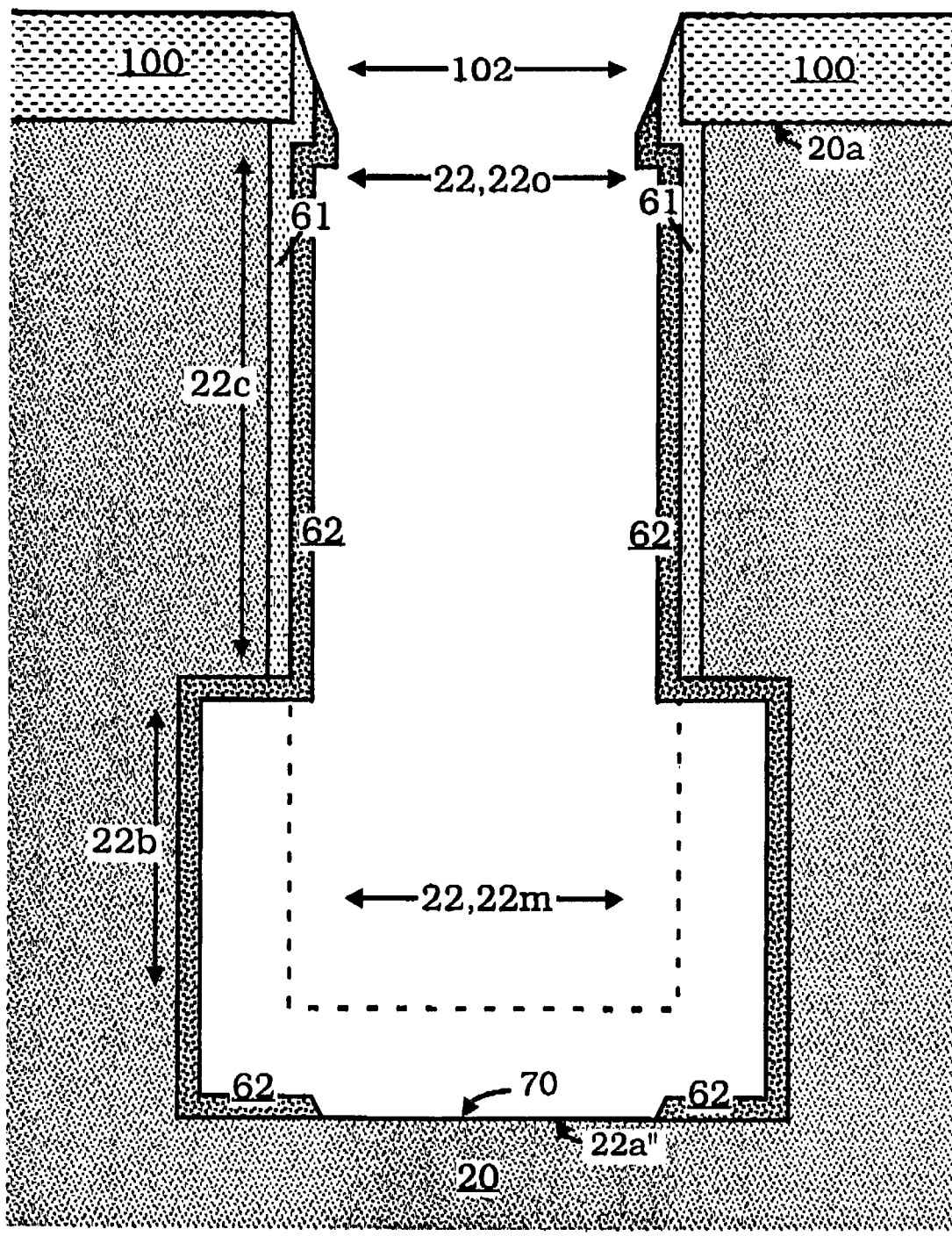
Figure 10:
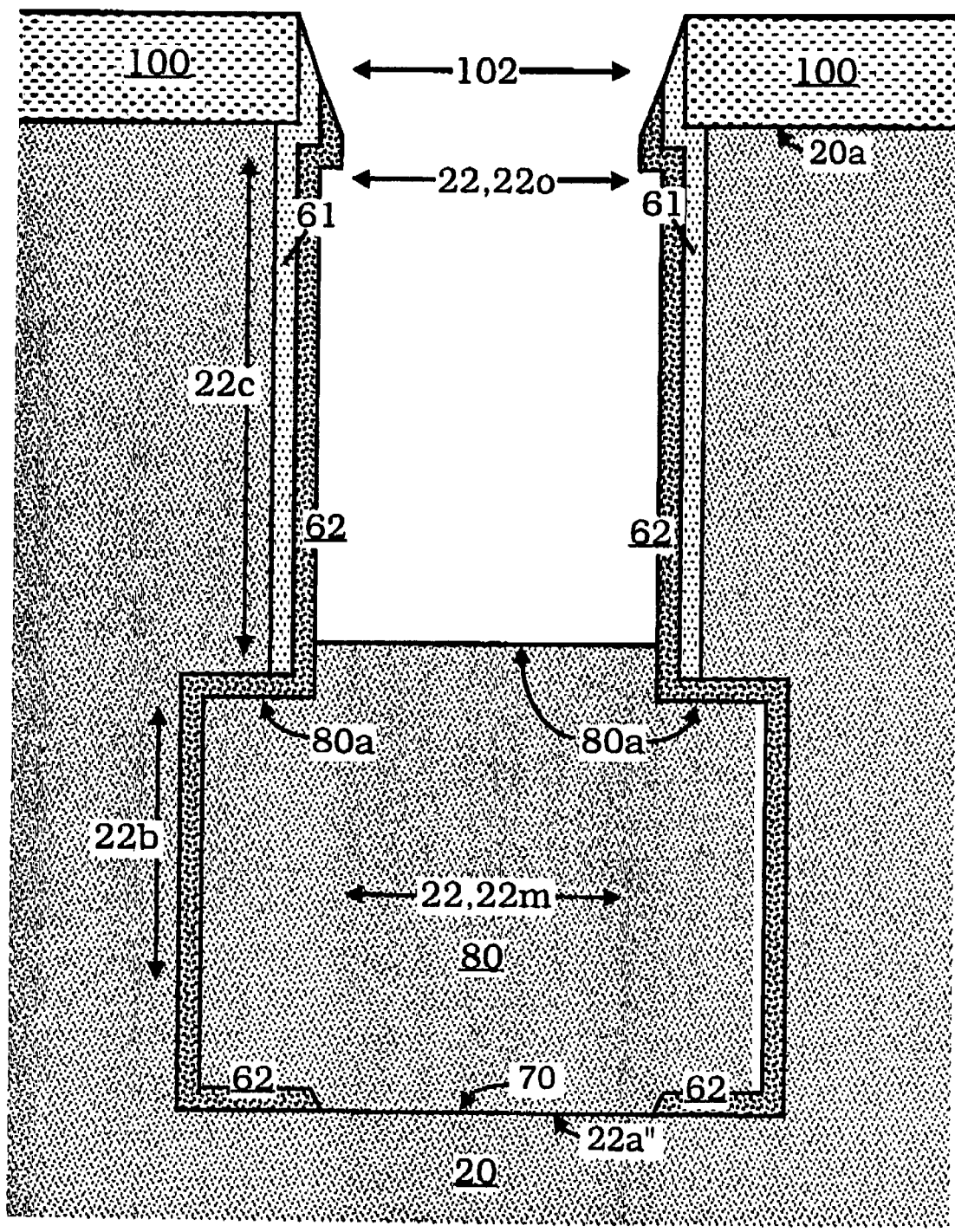

Then, as shown in FIG. 9, the respectively exposed lateral part of the second insulating layer or protective layer 62 is removed by anisotropic etching, so that the underlying single-crystal semiconductor substrate 20 is exposed by the overetching operation, in particular in the region of the second temporary bottom region 22a". The exposed region of the single-crystal semiconductor substrate 20 in the region of the second temporary bottom region 22a' serves as a seed layer 70 for the selective epitaxial growth of a single-crystal silicon material 80 to be subsequently carried out, the end state of which is illustrated in FIG. 10.

Figure 11:
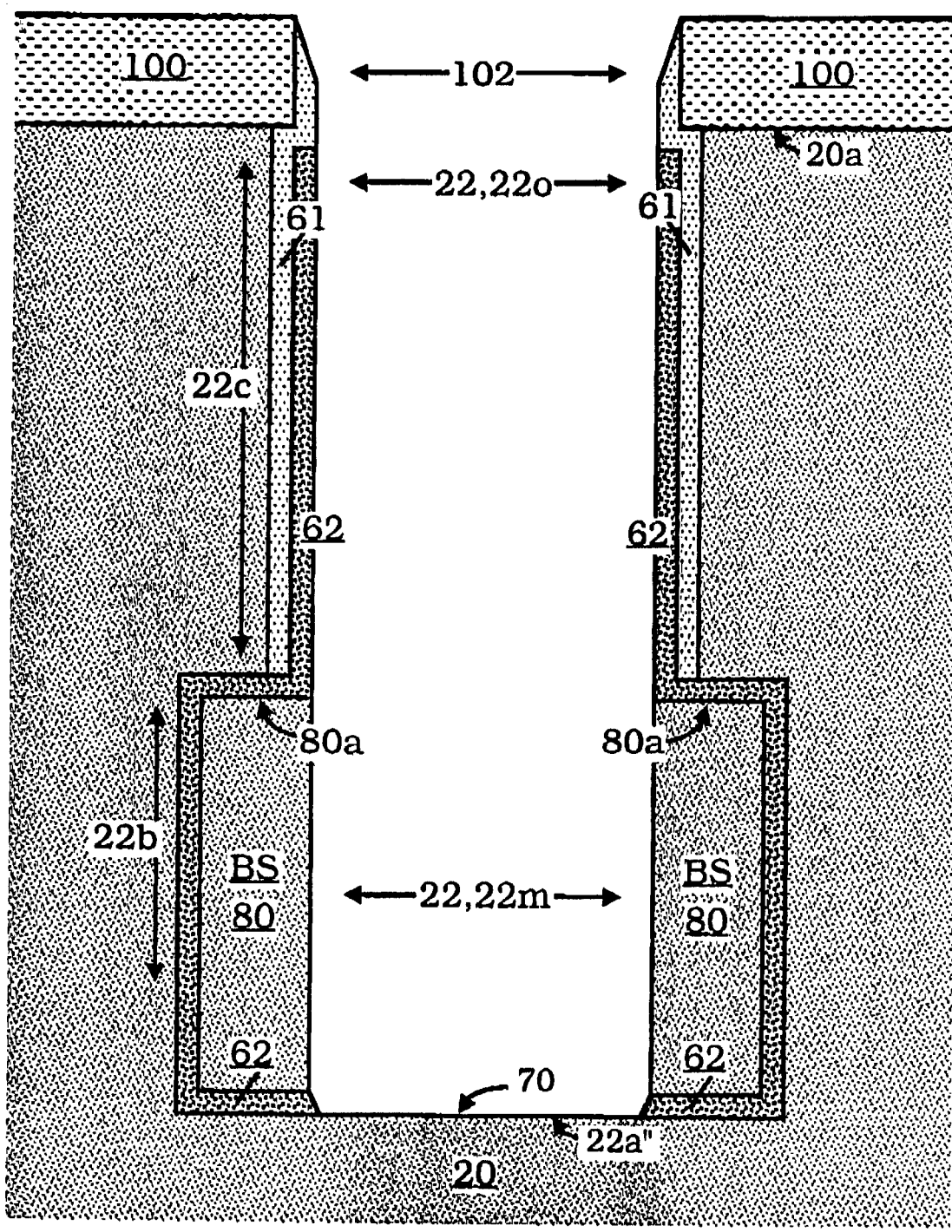

In the transition to the state of FIG. 11, the etching of the second trench portion 22m is then repeated in an anisotropic form, with the deposited second insulating layer or protective layer 62 being partially removed from the upper wall regions or edge regions 22c of the first or upper trench portion 22o and the epitaxially grown-on material 80 being removed outside the recesses 23 to below the level of the second temporary bottom region 22a".

Figure 12:
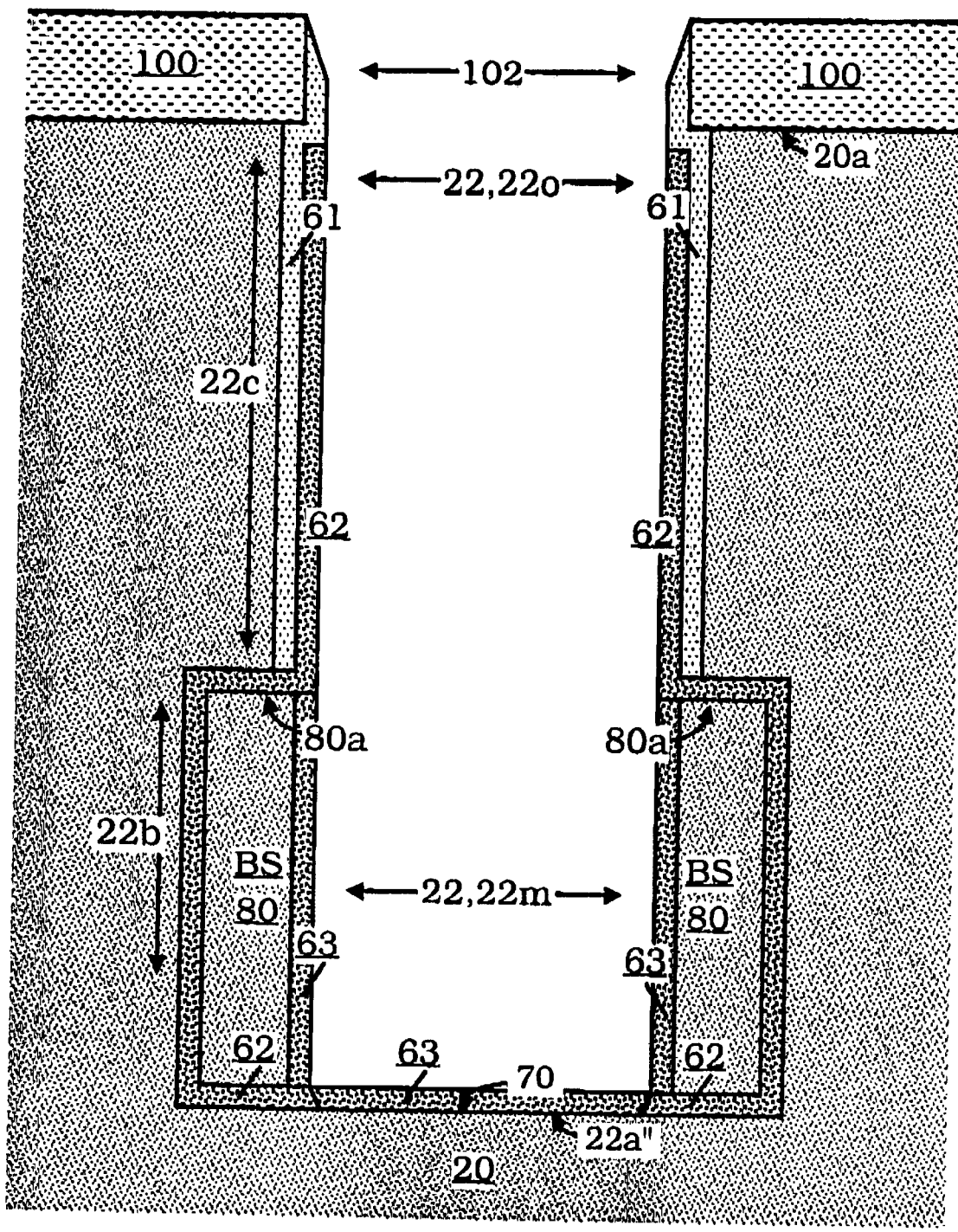

Following that, a third insulating layer or protective layer 63 is then formed in the form of a silicon dioxide layer, to be precise by selective, local oxidizing of the exposed silicon regions 70 and 80, as is shown in FIG. 12. In this case, the exposed regions of the epitaxially grown-on material 80 for the buried-strap region are embedded in the recesses 23 covered by the third insulating layer or protective layer 63 and are consequently protected.

Figure 13:
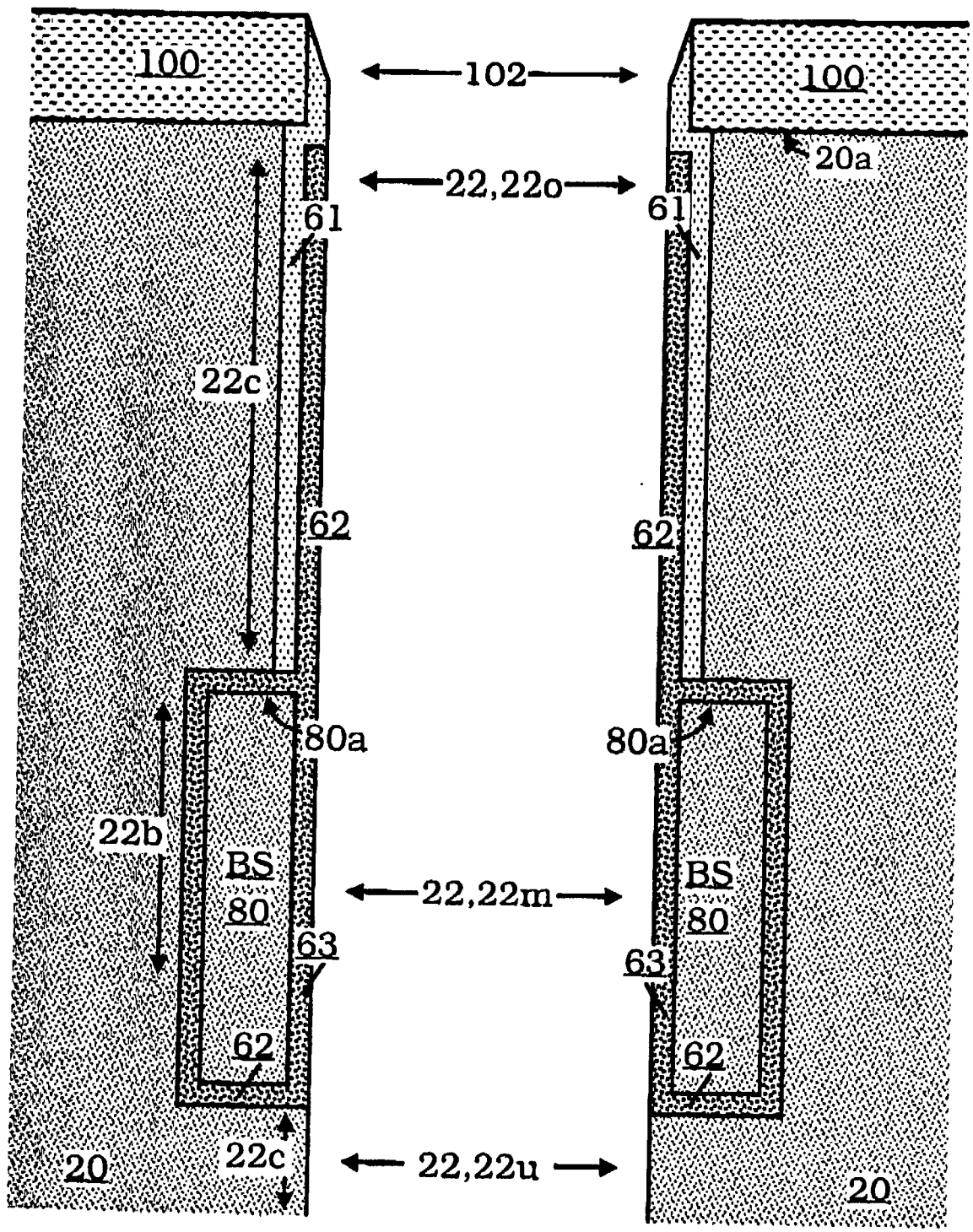

In the transition to the intermediate state shown in FIG. 13, the third or lower trench portion 22u is then formed by a further anisotropic etching step.

In a subsequent process sequence, the lower region of the circuit configuration is then formed in the semiconductor substrate in the lower trench portion 22u. This may, for example, concern the forming of a vertical storage capacitor with a node dielectric. Finally, what is known as the first conductivity region 30 is created by a polysilicon filling with an etching-back process to below the first temporary bottom region 22a', with the option that a fourth insulating layer 64 is provided in the form of a silicon nitride protection between the material of the first conductivity region 30 and the semiconductor substrate 20.

Figure 14:
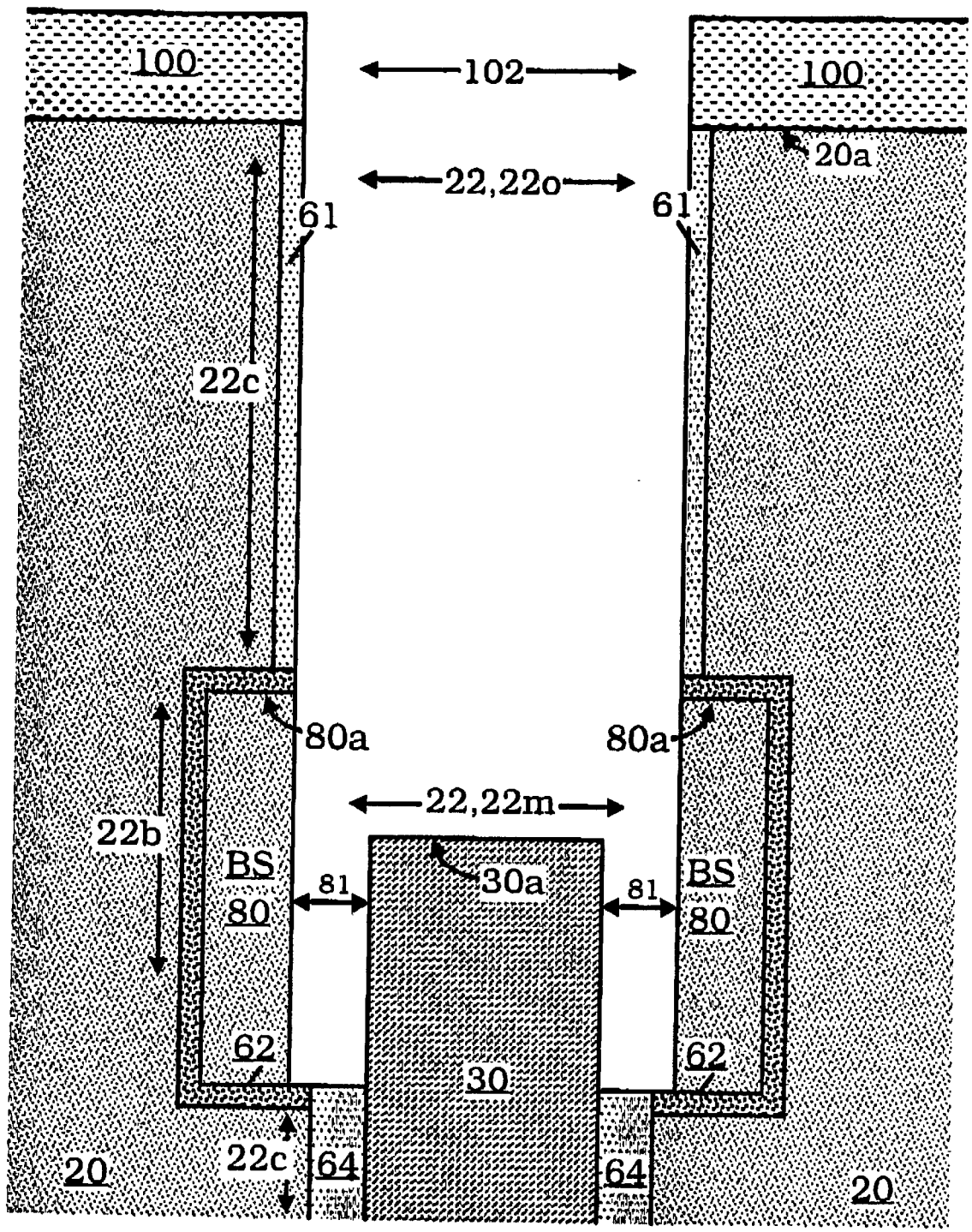

FIG. 14 shows in addition that the third protective layer or insulating layer 63 was subsequently removed from the epitaxially grown-on material 80 of the buried-strap region, so that now a gap 81 has been formed between the material of the first conductivity region 30 and the material 80 of the buried-strap region BS or the connection region BS.

Figure 15:
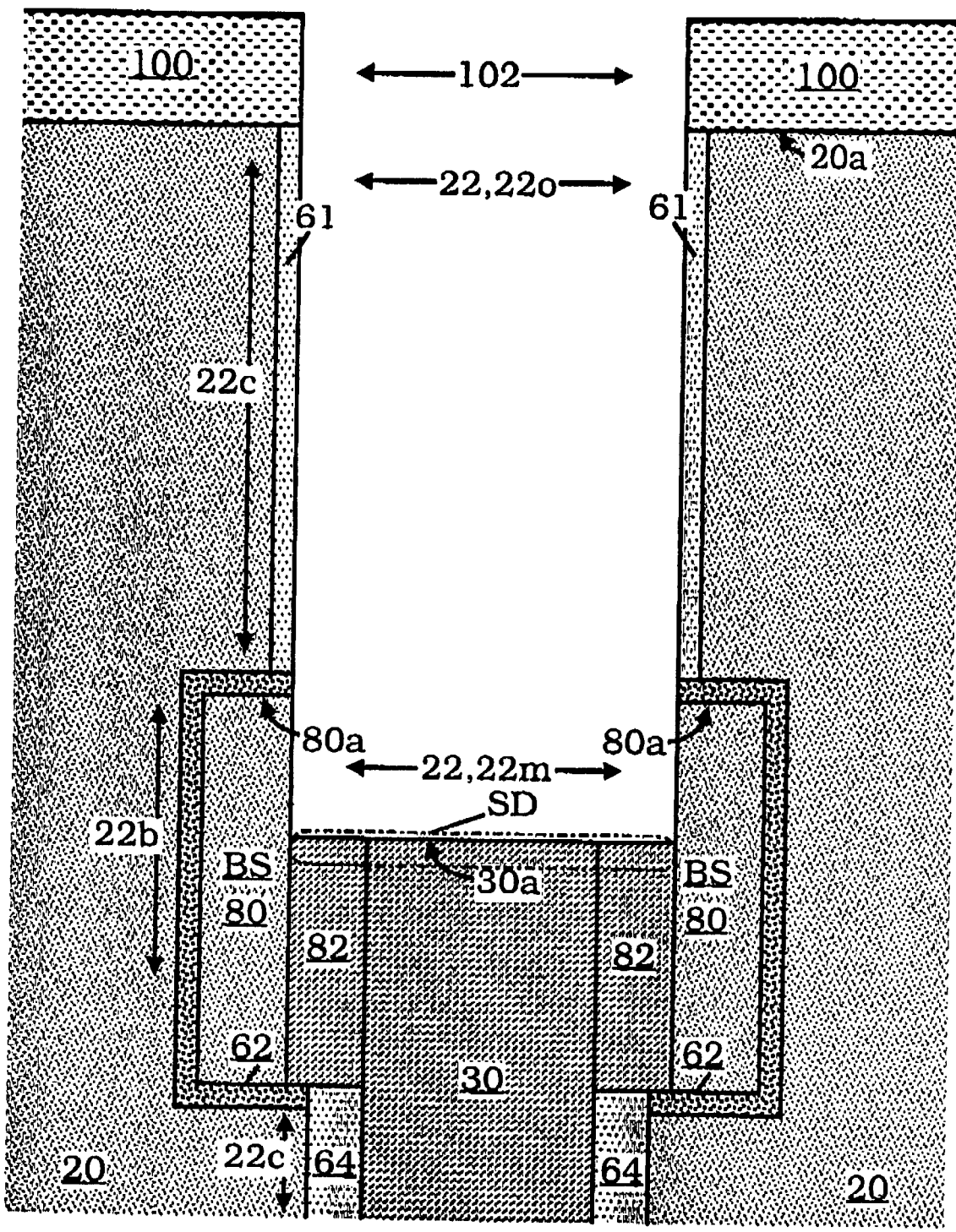

In the transition to the intermediate state shown in FIG. 15, the gap 81 is filled by selective depositing, for example by polysilicon filling 82 and subsequent etching back, so that there is then formed the region of the surface region 80a, hereafter what is referred to as the source-drain region SD of the vertical field-effect transistor to be formed, and it is connected in terms of material and in an electrically conducting manner to the buried-strap region or connection region BS, as is shown in FIG. 15.

Figure 16:
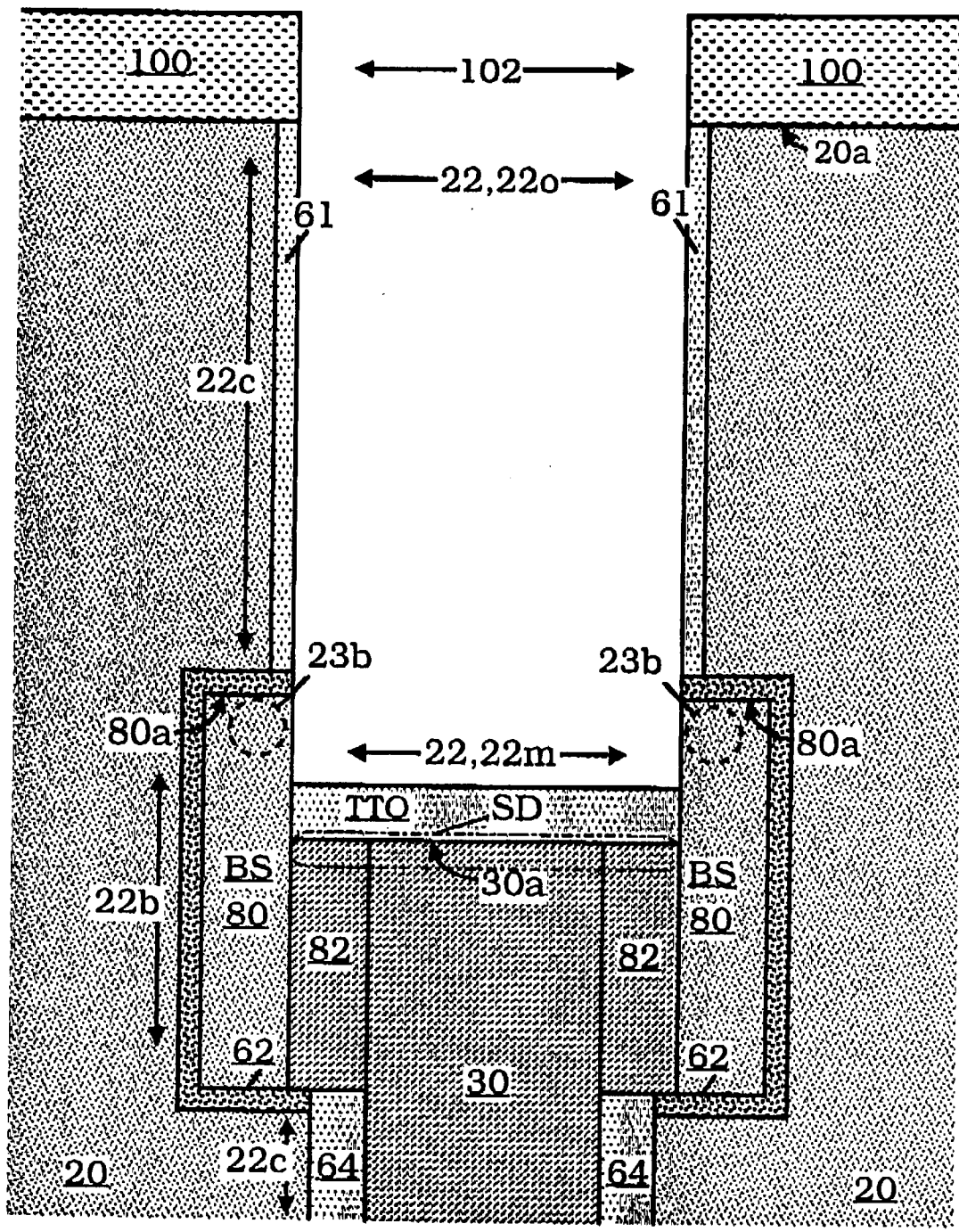

In the transition to the state of FIG. 16, what is known as the trench top oxide TTO is then anisotropically deposited, insulating a surface region 30a of the first conductivity region 30 and consequently what is known as the source-drain region SD of the vertical field-effect transistor to be formed with respect to the free volume lying above it of the first or upper trench portion 22o of the recess 22 or of the trench 22. At the same time, as is shown in FIG. 16, an upper region 23b of the material 80 of the buried-strap region or the connection region BS remains free.

Figure 17:
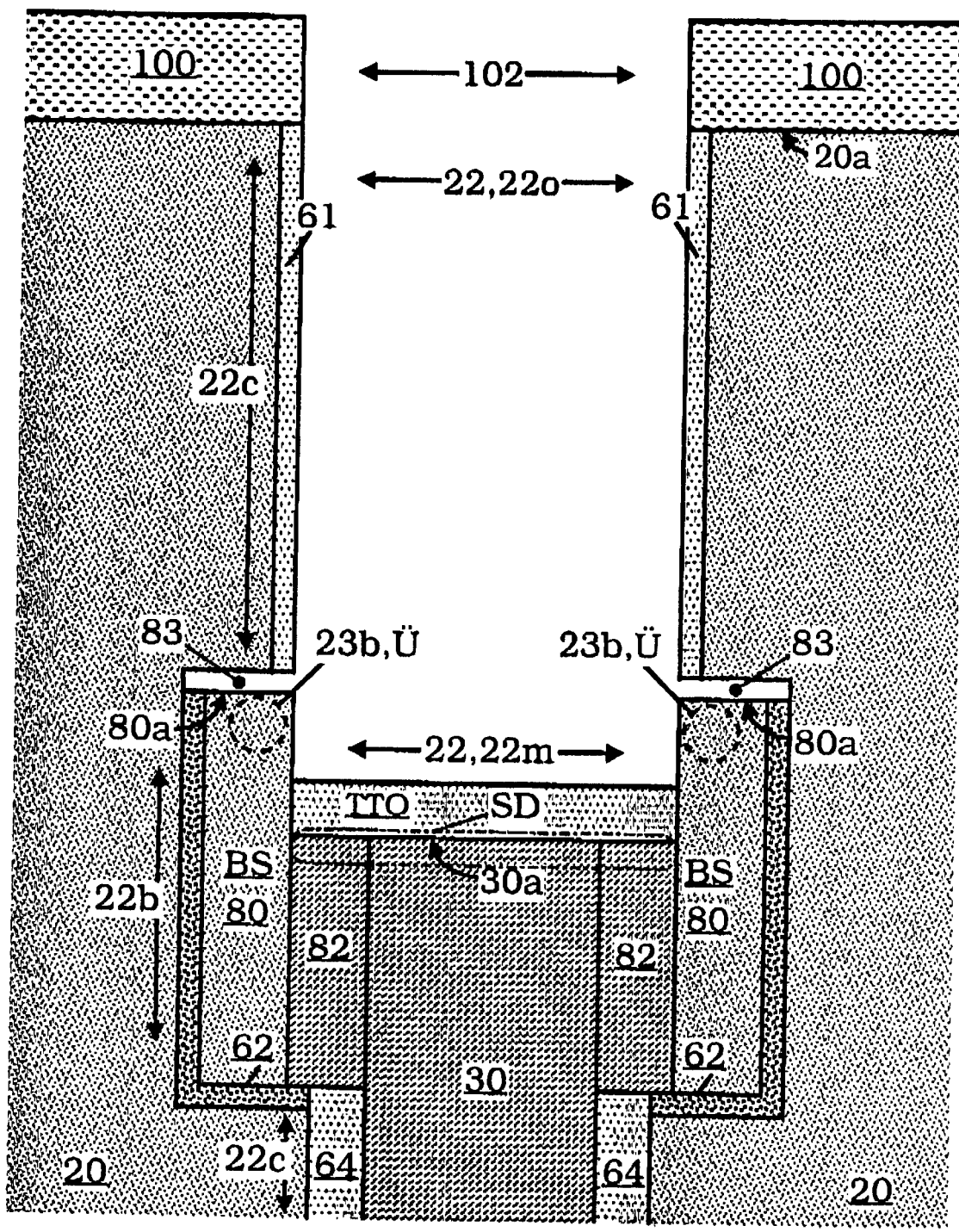

Following that, as is shown in FIG. 17, an isotropic etching operation is then performed. One effect of this is to remove part of the trench top oxide TTO. In particular, however, at the surface region 80a of the material 80 of the connection region BS, the material present there of the insulating region 24 or of the second insulating protective layer 62 is laterally removed, so that a gap 83 without an insulating material interposed is produced between the surface region 80a of the material 80 of the connection region BS and the semiconductor substrate 20 lying above it.

Figure 18:
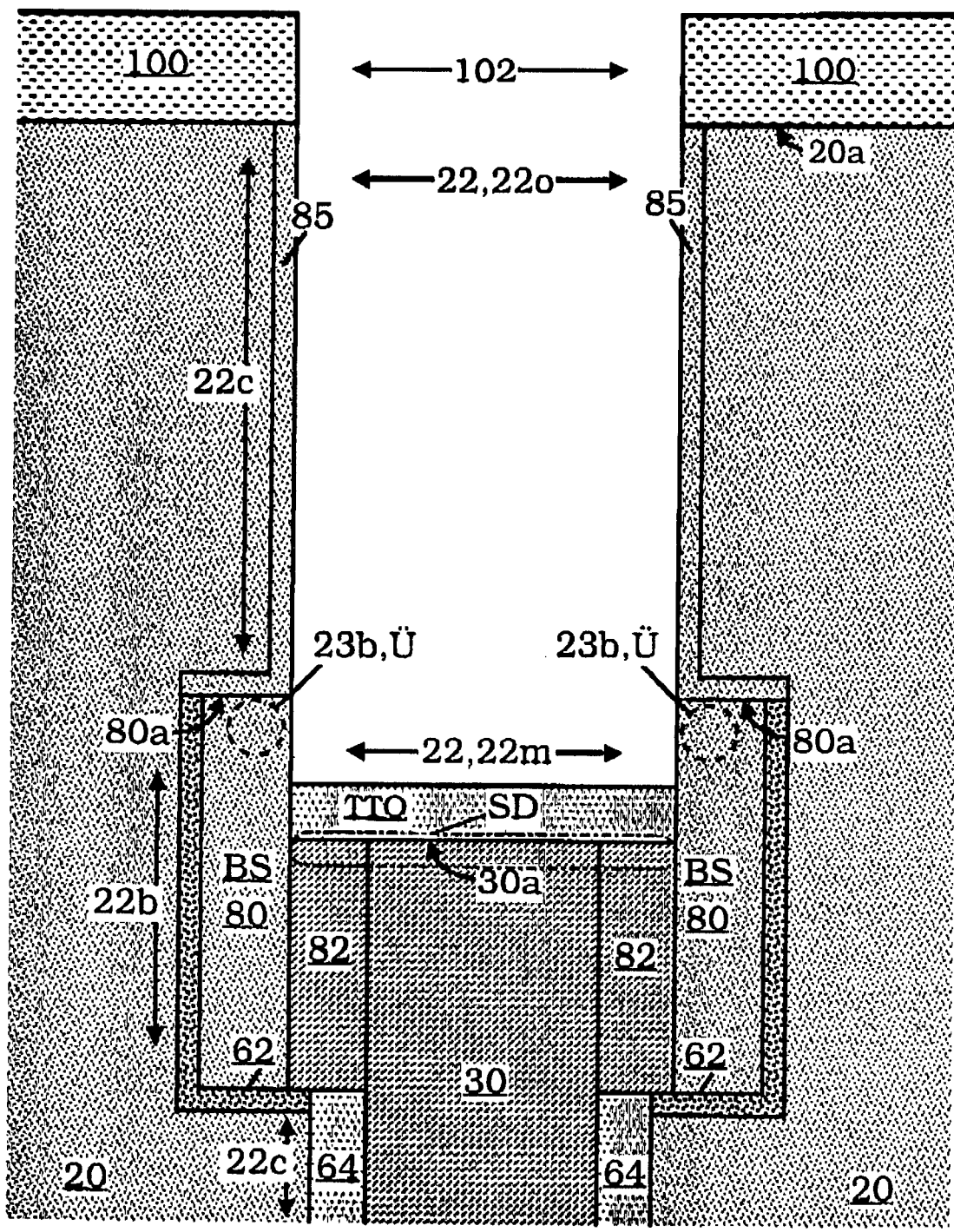

In the transition to the state of FIG. 18, the gap 83 is then filled by a conductive material 85, preferably by selective epitaxial growth of single-crystal semiconductor material 85, with the surface region 80a of the material 80 of the connection region BS serving as a core layer.

Figure 19:
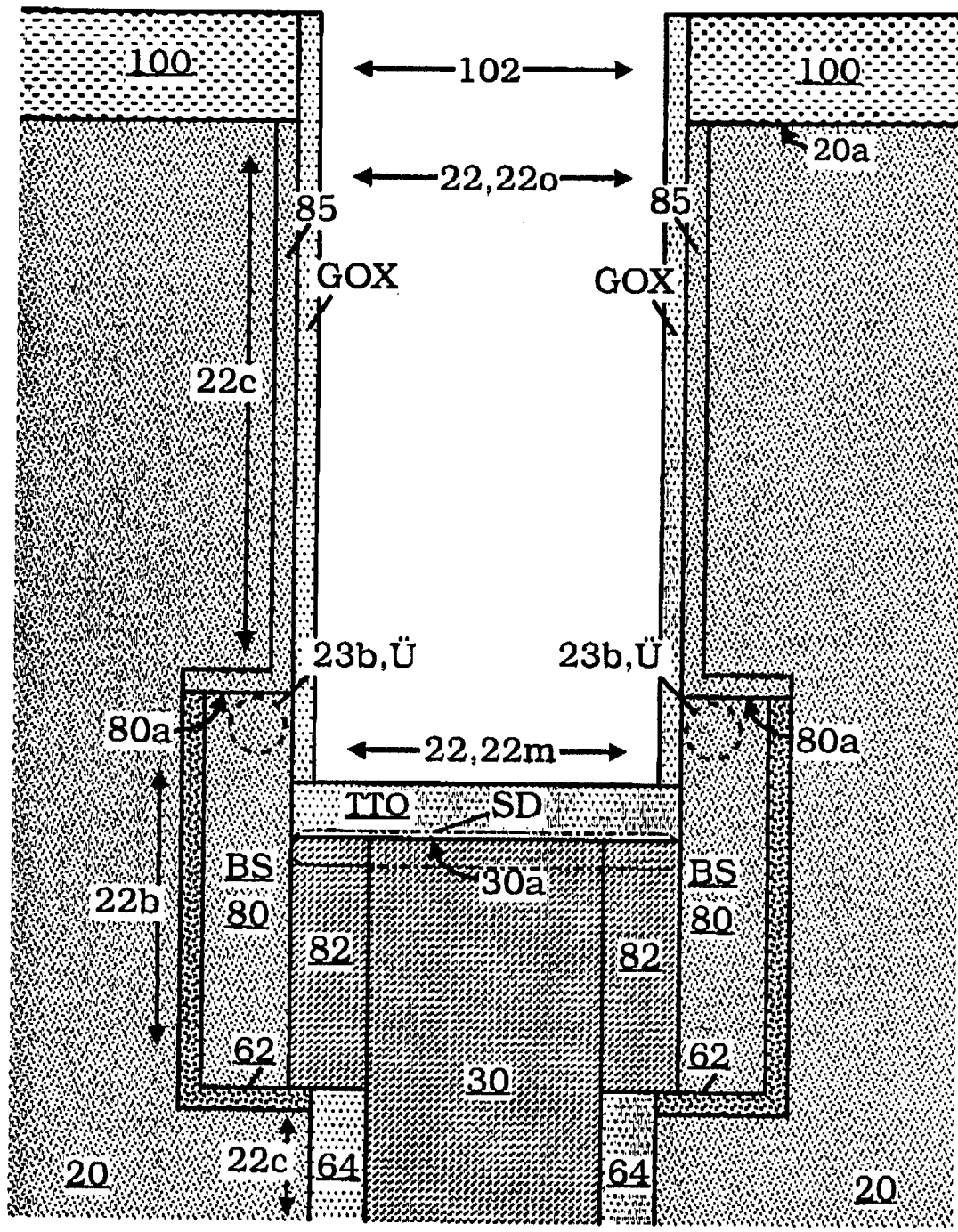

Following that, what is known as the gate oxide or the gate insulating region GOX is then formed in wall regions and edge regions 22c and 22b which have remained free until then, so that the upper portion 23b of the material 80 of the connection region BS forms the required overlapping region Ü, as is shown in FIG. 19.

Figure 20:
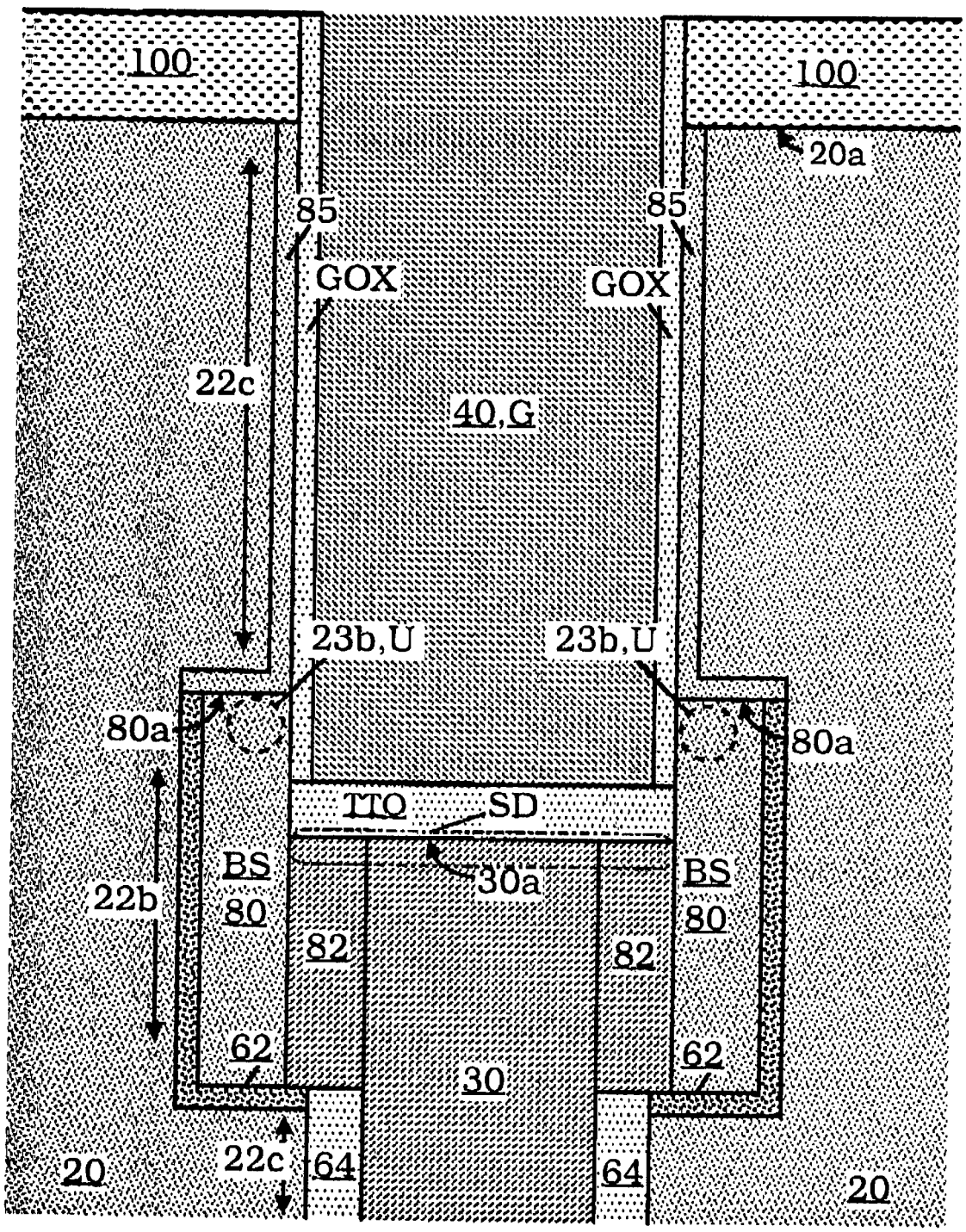

In the transition to the state of FIG. 20, the free volume of the upper trench portion 20o is then filled with a second conductivity region 40 as gate region G.

We claim:

1. A method of forming a field-effect transistor device, which comprises the steps of:
    providing a semiconductor substrate;
    forming a connection region in the semiconductor substrate;
    forming a conductivity region in the semiconductor substrate;
    forming a source drain region, the connection region extending to the source-drain region for connecting the field-effect transistor device to the conductivity region; and
    forming a potential source-drain channel path of the field-effect transistor device by providing a gate insulating region to an overlapping region of at least one of the source-drain region and the connection region, the overlapping region being formed directly as a material region with outdiffusion processes being avoided.

2. The method according to claim 1, which comprises forming the connection region and the overlapping region from substantially equivalent materials.

3. The method according to claim 1, which comprises forming the connection region and the overlapping region as one part or as one piece.

4. The method according to claim 1, which comprises growing at least one of the connection region and the overlapping region epitaxially.

5. The method according to claim 1, which comprises performing one of at least partially embedding and at least partially enclosing at least one of the connection region and the overlapping region in an insulating region for avoiding or suppressing outdiffusion processes from at least one of the connection region and the overlapping region and to avoid or suppress undesired electrical contacts of at least one of the connection region and of the overlapping region with further regions.

6. The method according to claim 1, which comprises forming at least one of the connection region, the overlapping region, and parts thereof as a buried-plate structure.

7. The method according to claim 1, which comprises forming the field-effect transistor device as a trench-structure transistor device in a trench.

8. The method according to claim 7, which comprises forming one of a recess and the trench in the semiconductor substrate.

9. The method according to claim 8, which comprises:
    forming the trench with an upper trench portion having upper wall regions and a middle trench portion, the field effect transistor being a vertically aligned trench-structure transistor device; and
    forming in the upper trench portion with the upper wall regions a gate region being substantially electrically insulated with respect to the upper wall regions and with respect to the middle trench portion.

10. The method according to claim 9, which comprises forming, spatially adjoining the gate region, substantially directly, the source-drain region, and the source-drain region and the connection region being formed in a region of the middle trench portion.

11. The method according to claim 10, which comprises forming the conductivity region substantially at least in a lower trench portion of the trench, and the conductive region being in substantially electrically conducting contact with at least the connection region.

12. The method according to claim 7, which comprises:
depositing a mask region on a surface region of the semiconductor substrate; and
structuring the mask region with recesses formed therein in accordance with a desired trench structure to be formed.

13. The method according to claim 7, which comprises using a single-crystal semiconductor material as the semiconductor substrate.

14. The method according to claim 7, which comprises structuring the trench in a number of process steps at least one of temporally separated and interrupted from one another.

15. The method according to claim 9, which comprises etching the upper trench portion with the upper wall regions into the semiconductor substrate to a depth in a range of 1 μm and with a temporary bottom region being formed.

16. The method according to claim 15, which comprises widening the upper trench portion.

17. The method according to claim 15, which comprises depositing a protective layer being a first protective layer in the trench.

18. The method according to claim 17, which comprises anisotropic etching, resulting in a penetration of the first protective layer at the temporary bottom region, resulting in the middle trench portion with middle wall regions being formed, and with a depth in a range of about 200–300 nm, and resulting a further temporary bottom region being formed.

19. The method according to claim 18, which comprises widening the middle trench portion in a region of the middle wall regions resulting in recesses being formed and defining an area of the connection region therein.

20. The method according to claim 19, which comprises forming the insulating region by forming a second protective layer in a conformal manner with a layer thickness in a range of about 10 nm and using a material selected from the group consisting of silicon dioxide $SiO_2$ and oxidized silicon nitride $Si_3N_4$.

21. The method according to claim 20, which comprises forming a single-crystal seed region for forming at least one of the connection region, the source-drain region and the overlapping region.

22. The method according to claim 21, which comprises:
using a single-crystal semiconductor material as the semiconductor substrate;
forming the single-crystal seed region by etching the second protecting layer in a region of the further temporary bottom region resulting in a penetration of the second protective layer at the further temporary bottom region of the middle trench portion, and an exposure of the semiconductor substrate at the further temporary bottom region.

23. The method according to claim 22, which comprises growing a single-crystal semiconductor material in a selectively epitaxial manner on the single-crystal seed region in such a way that the middle trench portion is completely filled, to just above a level of the temporary bottom region, with a varying dopant concentration being introduced in a form of a concentration gradient, and the recesses for the connection region formed in the middle wall regions being completely filled.

24. The method according to claim 23, which comprises:
vertically opening again the middle trench portion to just below a level of the further temporary bottom region; and
removing some of a material of the second insulation layer in the region of the upper wall regions.

25. The method according to claim 24, which comprises forming a third protective layer, so that the further temporary bottom region and, in the region of the middle wall regions, at least one of the single-crystal material selectively epitaxially grown in the recesses for the connection region, the source-drain region and the overlapping region, are covered, and the single-crystal material selectively epitaxially grown in the recesses forms at least one of the connection region, the source-drain region, and the overlapping region.

26. The method according to claim 25, which comprises producing the third protective layer by at least one of selective electrochemical depositing and transforming.

27. The method according to claim 26, which comprises
using an anisotropic etching process for forming a lower trench portion of the trench in which the conductivity region is formed;
forming the conductivity region by filling the lower trench portion to a level beneath the temporary bottom region with polysilicon and appropriate anisotropic etching back; and
forming a fourth protective layer between the semiconductor substrate and the conductivity region.

28. The method according to claim 27, which comprises using an etching step for removing the third protective layer covering the single-crystal material in the recesses for forming the connection region.

29. The method according to claim 28, which comprises performing at least one of filling with polysilicon and selective epitaxial growing for closing gaps formed between the conductivity region and the connection region for electrically contacting the conductivity region with the connection region, and a part of the connection region in the middle wall regions of the trench remain uncovered.

30. The method according to claim 29, which comprises covering a surface region of the conductivity region with a fifth protective layer with at least the part of the connection region remaining free and uncovered.

31. The method according to claim 30, which comprises performing an etching process, at least in a region of a transition between the middle trench portion and the upper trench portion in an area of the recesses for removing the second protective layer resulting in a substantially laterally extending further recess being created in an upper region of the connection region.

32. The method according to claim 31, which comprises filling the substantially laterally extending further recess in the upper region of the connection region with an electrically conductive material, resulting in a connection being formed between the conductivity region and at least the connection region.

33. The method according to claim 32, which comprises performing the step of the filling of the substantially laterally extending further recess in the upper region of the connection region by one of selective epitaxial growing and a hydrogen reflow process.

34. The method according to claim 32, which comprises:
depositing a sixth protective layer as a gate insulating region at regions remaining free of the upper and middle wall regions; and
filling a volume of the trench remaining free with a second conductivity region for forming the gate region.

35. The method according to claim 1, which comprises forming at least one of the connection region and the overlapping region from a single crystal.

36. The method according to claim 1, which comprises forming at least one of the connection region and the overlapping region from a selective epitaxial single-crystal doped silicon.

37. The method according to claim 1, which comprises forming the buried-plate structure in a buried form.

38. The method according to claim 1, which comprises forming the field-effect transistor device as a deep-trench transistor.

39. The method according to claim 1, which comprises forming the field-effect transistor device as a deep-trench transistor for connecting to a DRAM memory cell.

40. The method according to claim 10, which comprises forming the source-drain region beneath the gate region.

41. The method according to claim 12, which comprises forming the mask region in a multi-layered manner.

42. The method according to claim 13, which comprises using doped single-crystal silicon as the single-crystal semiconductor material.

43. The method according to claim 16, which comprises using an isotropic etching-back step for laterally widening the upper trench in a range of about 5 nm.

44. The method according to claim 16, which comprises using a silicon pull-back process for laterally widening the upper trench in a range of about 5 nm.

45. The method according to claim 17, which comprises forming the protective layer in a conformal manner with a layer thickness in a range of about 5 nm.

46. The method according to claim 45, which comprises forming the protective layer as a $Si_3N_4$ layer.

47. The method according to claim 19, which comprises using one of an isotropic etching-back step and a silicon pull-back process for the widening of the middle trench portion laterally, the widening being in a range of a layer thickness of about 20–40 nm.

48. The method according to claim 21, which comprises forming the connection region, the source-drain region and the overlapping region as single-crystal epitaxial semiconductor material regions.

49. The method according to claim 22, which comprises using an anisotropic etching process for the etching step.

50. The method according to claim 24, which comprises performing the step of vertically opening again the middle trench portion using an anisotropic etching process.

51. The method according to claim 26, which comprises performing the transforming step for producing the third protective layer by oxidation of a silicon material.

52. The method according to claim 29, which comprises forming the fifth protective layer from silicon dioxide.

53. The method according to claim 31, which comprises performing an isotropic etching as the etching process.

54. The method according to claim 25, which comprises forming the third protective layer as an insulating layer.

55. The method according to claim 27, which comprises forming the fourth protective layer as an insulating layer.

56. The method according to claim 27, which comprises forming the fourth protective layer as a silicon nitride layer.

57. The method according to claim 30, which comprises forming the fifth protective layer as an insulating layer.

58. The method according to claim 1, which comprises forming the overlapping region with outdiffusion processes being avoided to a greatest extent.

* * * * *